United States Patent
Yamaguchi et al.

[11] Patent Number: 6,008,884
[45] Date of Patent: Dec. 28, 1999

[54] PROJECTION LENS SYSTEM AND APPARATUS

[75] Inventors: Kotaro Yamaguchi, Yokohama; Kiyoshi Hayashi, Koganei; Tomawaki Takahashi, Yokohama, all of Japan

[73] Assignee: Nikon Corporation, Tokyo, Japan

[21] Appl. No.: 09/067,771

[22] Filed: Apr. 27, 1998

[30] Foreign Application Priority Data

Apr. 25, 1997 [JP] Japan .................................. 09-123456
Apr. 16, 1998 [JP] Japan .................................. 10-106805

[51] Int. Cl.$^6$ .................................................. G03B 27/42
[52] U.S. Cl. ........................... 355/53.54; 355/53; 355/67; 359/649; 359/713; 359/658
[58] Field of Search ........................... 355/53, 67, 53.54; 359/649, 713, 658

[56] References Cited

U.S. PATENT DOCUMENTS

| | | | |
|---|---|---|---|
| 3,504,961 | 4/1970 | Hoogland et al. | 350/214 |
| 3,897,138 | 7/1975 | Kano | 350/183 |
| 3,909,115 | 9/1975 | Kano | 350/214 |
| 4,619,508 | 10/1986 | Shibuya et al. | 353/122 |
| 4,666,273 | 5/1987 | Shimizu | 353/101 |
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,851,978 | 7/1989 | Ichihara | 362/268 |
| 4,891,663 | 1/1990 | Hirose | 355/53 |
| 4,931,830 | 6/1990 | Suwa et al. | 355/71 |
| 4,939,630 | 7/1990 | Kikuchi et al. | 362/268 |
| 4,948,238 | 8/1990 | Araki et al. | 350/469 |
| 5,105,075 | 4/1992 | Ohta | 250/201.2 |
| 5,170,207 | 12/1992 | Tezuka et al. | 355/53 |
| 5,172,275 | 12/1992 | Dejager | 349/755 |
| 5,237,367 | 8/1993 | Kudo | 355/67 |
| 5,260,832 | 11/1993 | Togino et al. | 359/679 |
| 5,307,207 | 4/1994 | Ichihara | 359/622 |
| 5,392,094 | 2/1995 | Kudo | 355/67 |
| 5,437,946 | 8/1995 | McCoy | 430/5 |
| 5,473,410 | 12/1995 | Nishi | 355/53 |
| 5,477,304 | 12/1995 | Nishi | 355/53 |
| 5,555,479 | 9/1996 | Nakagiri et al. | 359/355 |
| 5,617,182 | 4/1997 | Wakamoto et al. | 355/53 |
| 5,623,365 | 4/1997 | Kuba | 359/569 |
| 5,636,000 | 6/1997 | Ushida et al. | 355/30 |
| 5,717,518 | 2/1998 | Shafer et al. | 359/357 |
| 5,781,278 | 7/1998 | Matsuzawa et al. | 355/53 |
| 5,808,814 | 9/1998 | Kudo | 359/754 |
| 5,831,776 | 11/1998 | Sasaya, et al. | 359/754 |
| 5,834,770 | 11/1998 | Matsuzawa et al. | 359/649 |
| 5,835,285 | 11/1998 | Matsuzawa et al. | 359/754 |
| 5,856,883 | 1/1999 | Sander | 359/389 |

FOREIGN PATENT DOCUMENTS

| | | | |
|---|---|---|---|
| 712019 A2 | 5/1996 | European Pat. Off. | G02B 13/24 |
| 717299 A1 | 6/1996 | European Pat. Off. | G02B 13/24 |
| 721150 A2 | 7/1996 | European Pat. Off. | G03F 7/20 |

(List continued on next page.)

OTHER PUBLICATIONS

"Quality of Microlithographic Projection Lenses" by J. Braat, SPIE Proceedings, vol. 811, Optical Microlithographic Technology for Integrated Circuit Fabrication and Inspection, H. Stover, S. Wittekoek, Eds., pp. 22–30 (Apr. 1987).

*Primary Examiner*—Eddie C. Lee
*Assistant Examiner*—Emily C Jones
*Attorney, Agent, or Firm*—Downs Rachlin & Martin PLLC

[57] ABSTRACT

A high-performance dioptric reduction projection lens and projection exposure apparatus and projection exposure method using same. The projection lens includes six lens groups and has a positive negative positive negative positive refractive power arrangement. The third and fifth lens groups have overall positive refractive power and include at least three lens elements having positive refractive power. The fourth lens group has negative refractive power and includes at least three lens elements having negative refractive power. At least one lens element in either the fourth lens group or the fifth lens group includes an aspheric surface. The projection lens preferably satisfies at least one of a number of design conditions.

24 Claims, 23 Drawing Sheets

FOREIGN PATENT DOCUMENTS

| | | | |
|---|---|---|---|
| 732605 A2 | 9/1996 | European Pat. Off. | G02B 13/14 |
| 733605 A1 | 9/1996 | European Pat. Off. | C04B 35/45 |
| 770895 A2 | 5/1997 | European Pat. Off. | G02B 13/14 |
| 803755 A2 | 10/1997 | European Pat. Off. | G02B 9/62 |
| 5512902 | 1/1980 | Japan | G02B 13/26 |
| 63-118115 | 5/1988 | Japan | G02B 13/24 |
| 5034593 | 2/1993 | Japan | G02B 13/24 |
| 5173065 | 7/1993 | Japan | G02B 13/14 |
| 6313845 | 11/1994 | Japan | G02B 13/24 |
| 7128592 | 5/1995 | Japan | G02B 13/18 |
| 7140385 | 6/1995 | Japan | G02B 13/24 |

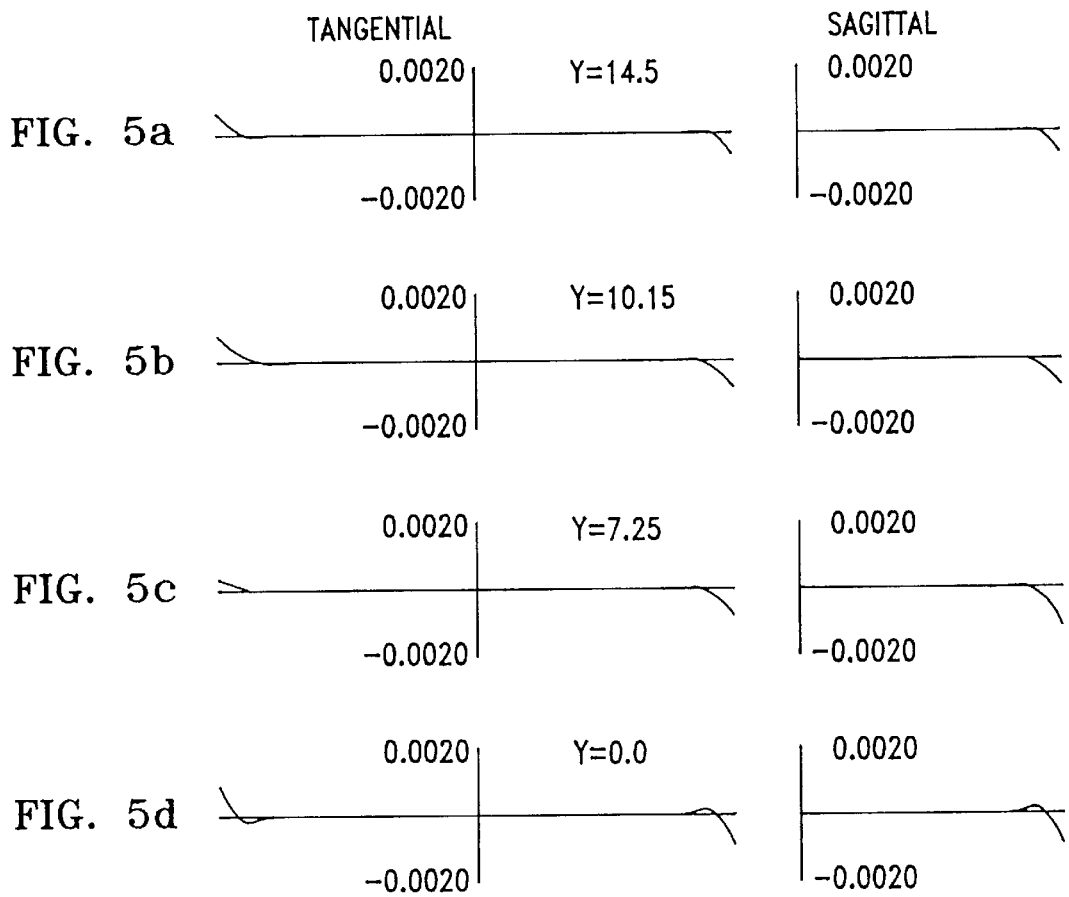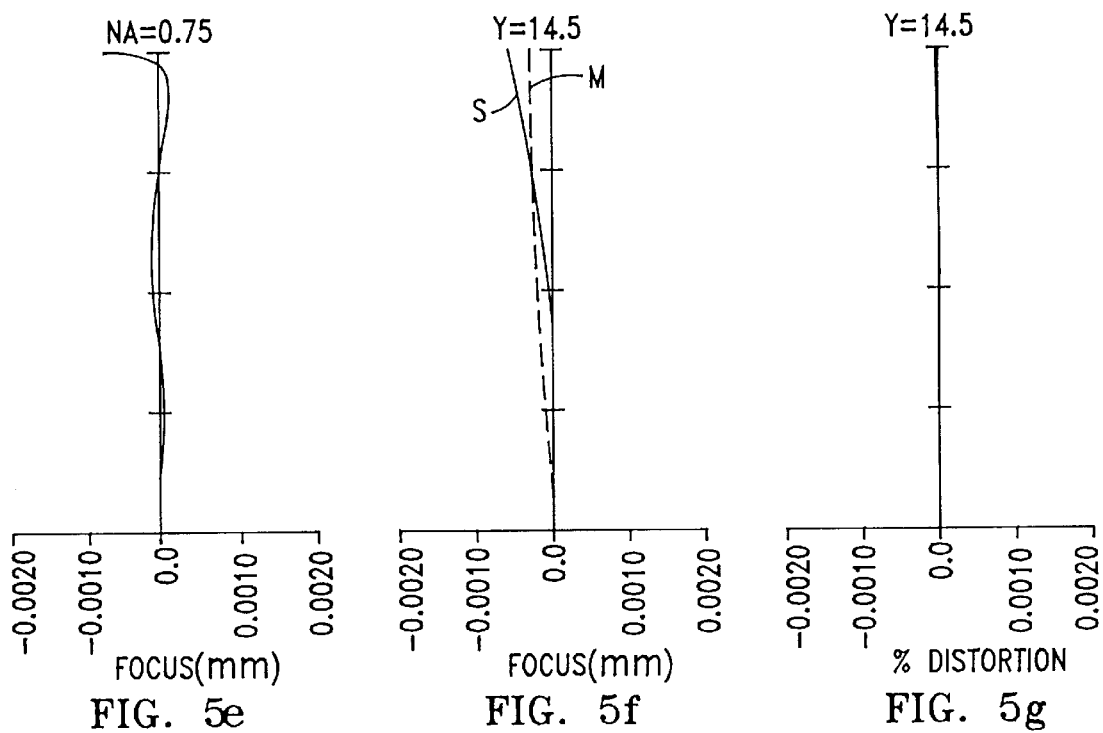

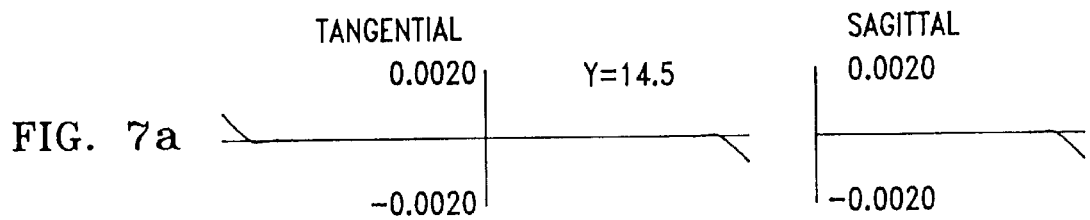
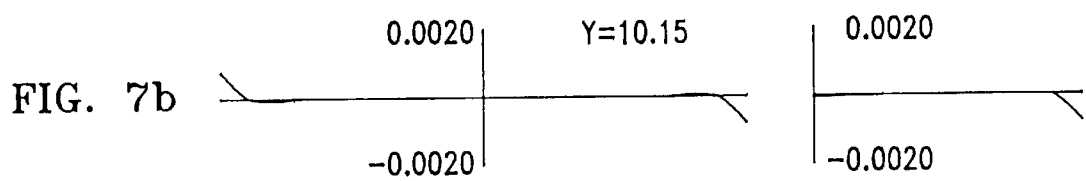
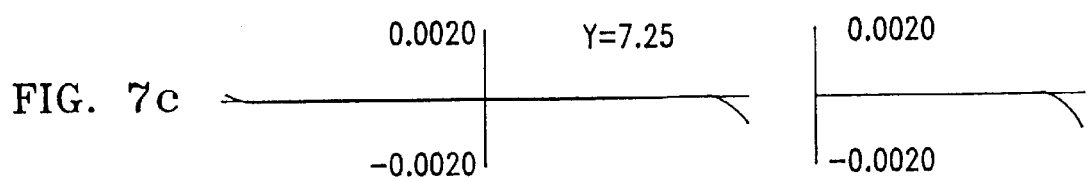
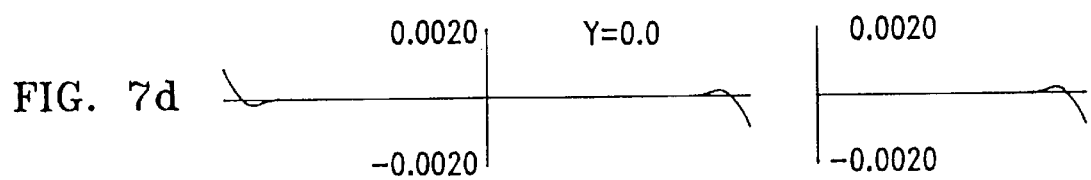
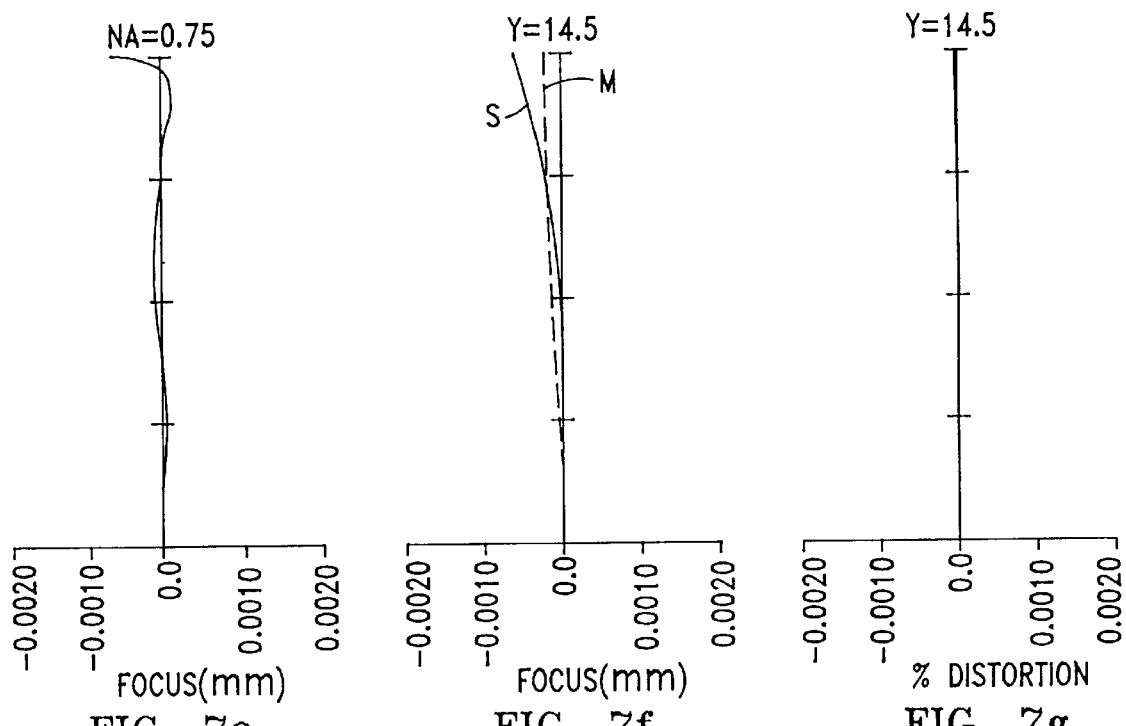

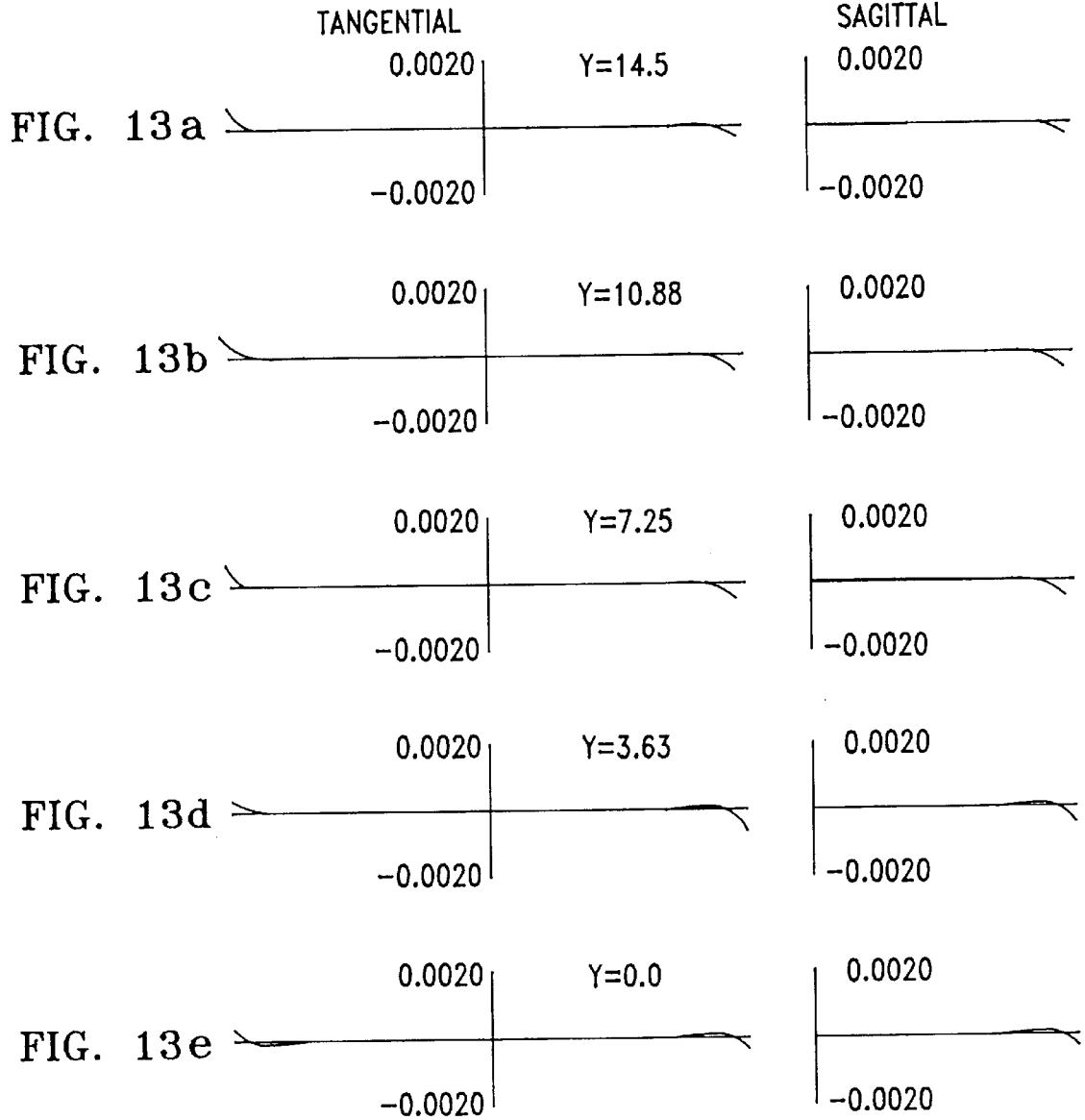

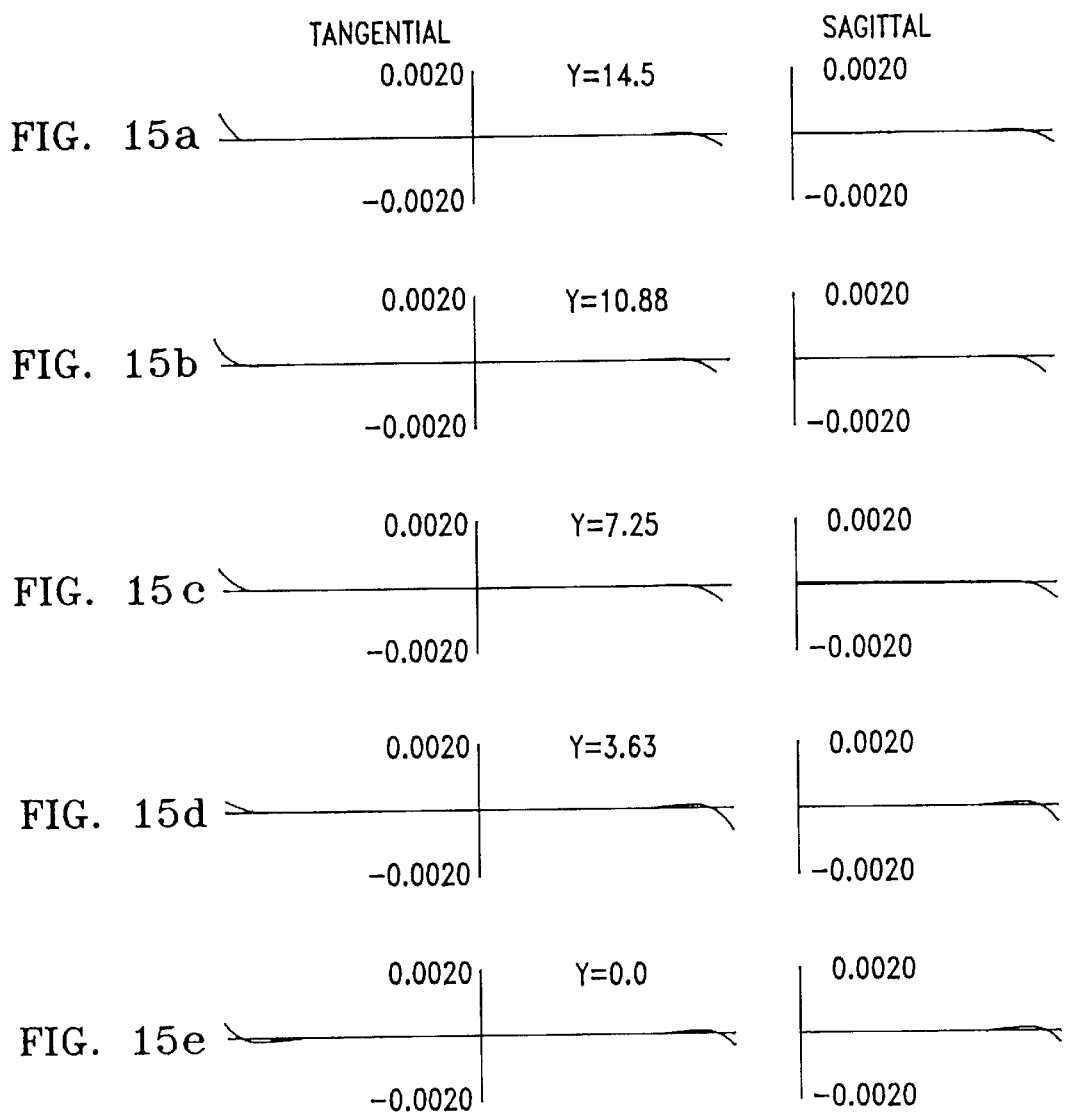

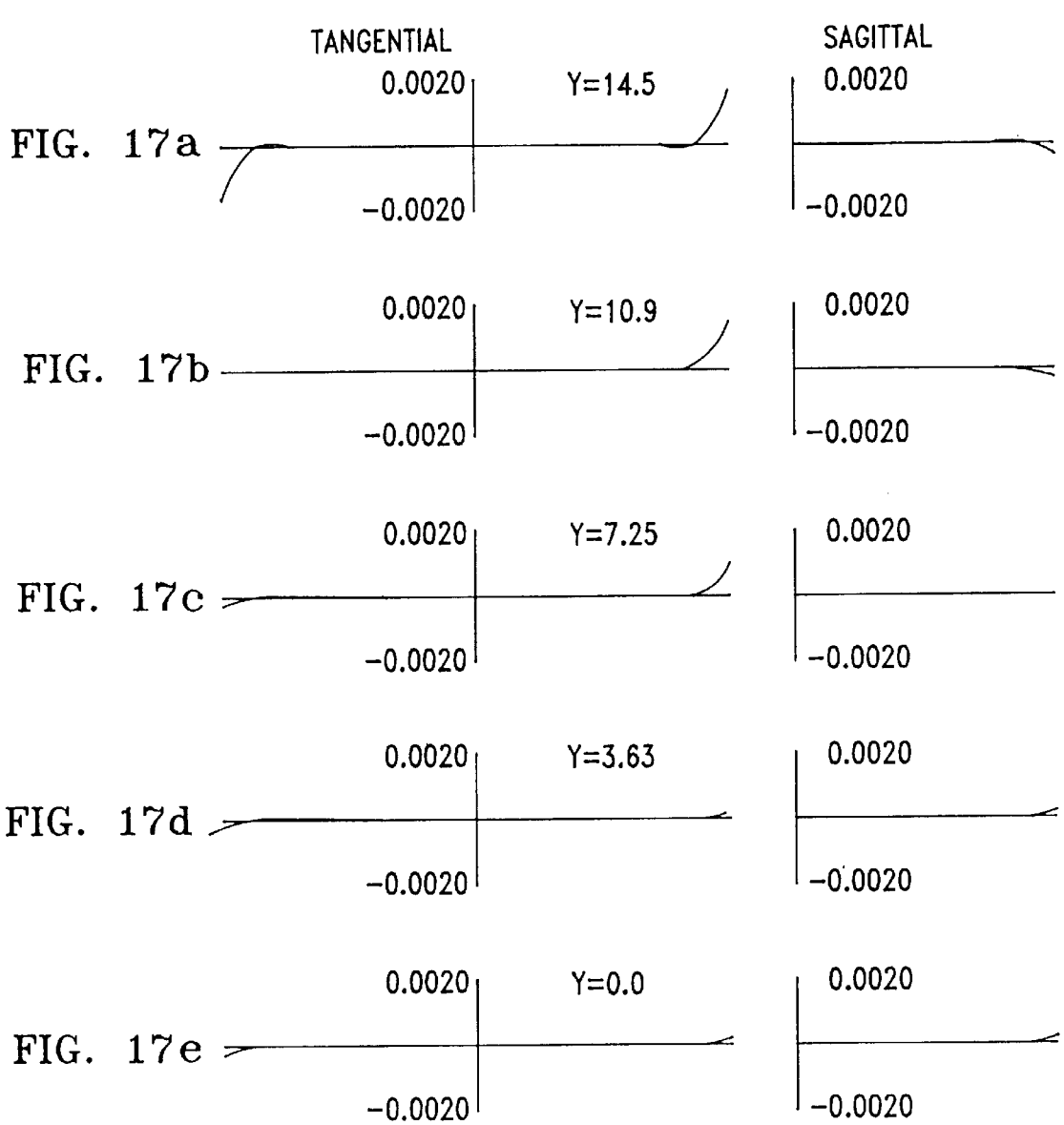

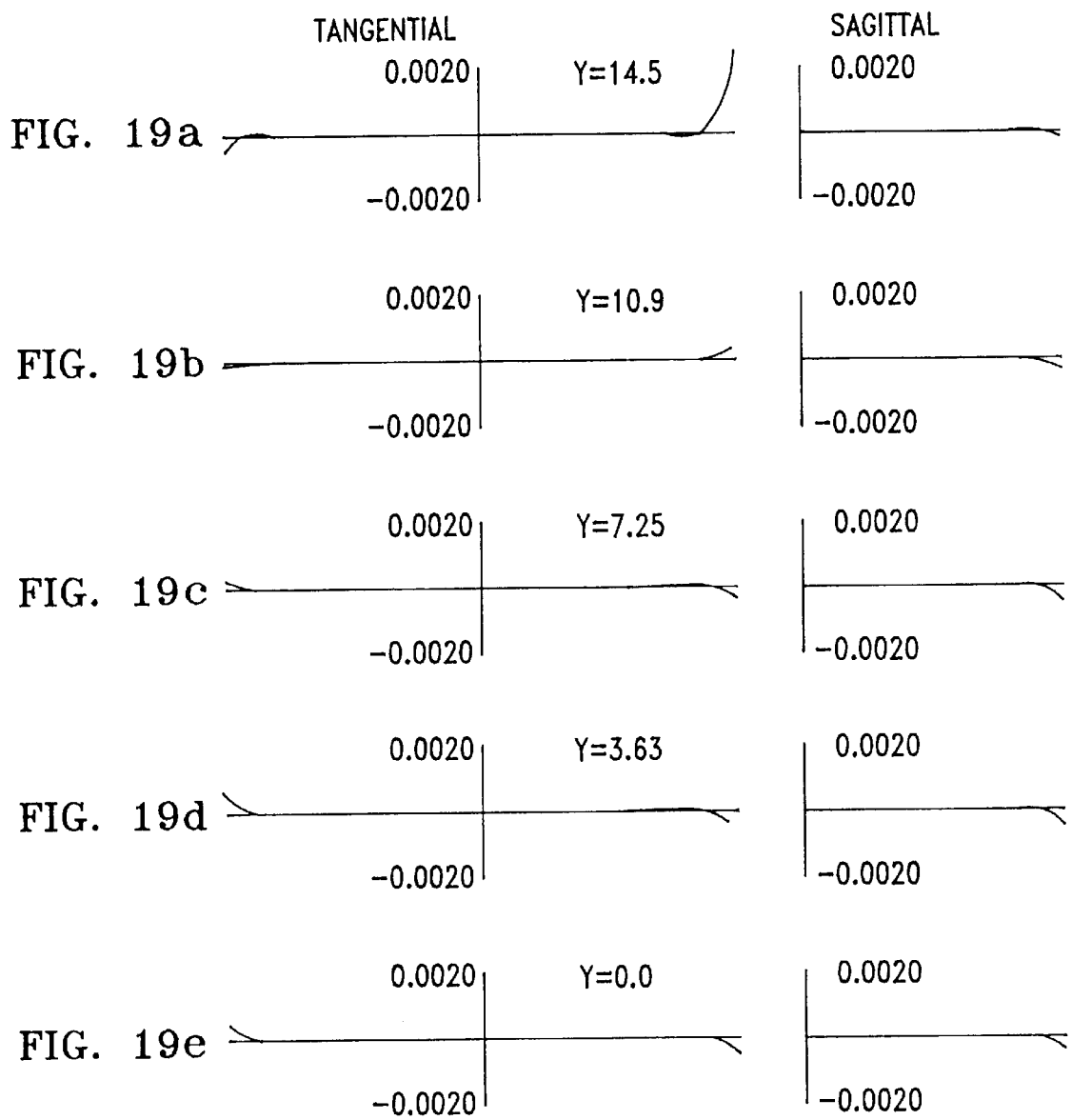

PROJECTION LENS SYSTEM AND APPARATUS

FIELD OF THE INVENTION

The present invention relates to projection lenses and projection exposure apparatuses and apparatus, and more particularly to high-performance dioptric reduction projection lenses, and methods of projection exposure using same.

BACKGROUND OF THE INVENTION

Due to the increasing integration scale (i.e., microminiaturization) of integrated circuits and other electronic devices (e.g., liquid crystal displays), the performance requirements for projection exposure apparatuses have become more demanding. The preferred avenues for meeting these demands is to increase the numerical aperture (NA) of the projection lens system (hereinafter, "projection lens") and/or decrease the wavelength of light used in the projection exposure apparatus.

Increasing the NA of the projection lens is a challenging problem in lens design because of the difficulty in correcting aberrations, particularly when the size of the exposure field needs to be relatively large. One way to achieve the proper degree of aberration correction is through the use of aspheric lens elements. Also, aspheric lens elements reduce the number of lens elements in the projection lens, which increases transmission and makes the lens lighter. The projection lenses disclosed in Japanese Patent Applications Kokai No. Hei 1-315709, 5-34593, and 7-128592 use aspheric surfaces, but the NA and the size of the exposure field are not sufficiently large.

SUMMARY OF THE INVENTION

The present invention relates to projection lenses, and more particularly to high-performance dioptric reduction projection lenses, and methods of projection exposure using same.

One aspect of the invention is a projection lens having an object plane and an image plane and comprising object to imagewise six lens groups. The first lens group has positive refractive power. The second lens group has negative refractive power. The third lens group has positive refractive power, and includes at least three lens elements having positive refractive power. The fourth lens group has overall negative refractive power and includes at least three lens elements having negative refractive power. The fifth lens group has overall positive refractive power and includes at least three lens elements having positive refractive power. The sixth lens group has positive refractive power. Also, at least one lens element in either the fourth lens group or the fifth lens group includes at least one aspheric surface. The projection lens also has a numerical aperture larger than 0.6.

In another aspect of the invention, the projection lens described above satisfies one or more of the following design conditions:

$0.1 < f_1/f_3 < 15$ $0.05 < f_2/f_4 < 6$ $0.01 < f_5/L < 1.2$ $0.02 < f_6/L < 1.8$ $-0.3 < f_4/L < -0.005$ $-0.5 < f_2/L < -0.005$.

Another aspect of the invention is a projection exposure apparatus, which includes a projection lens as described above. The projection exposure apparatus also includes a reticle holder capable of holding a reticle at or near the object plane of the projection lens. A source of illumination is disposed adjacent the reticle holder on the side opposite the projection lens. The projection exposure apparatus also includes a workpiece holder disposed adjacent the projection lens on the image plane side thereof. The work piece holder is capable of holding a workpiece at or near the image plane of the projection lens.

BRIEF DESCRIPTION OF THE DRAWINGS

FIGS. 5a–5d are plots of lateral chromatic aberration (tangential and sagittal) for various field heights Y for Working Example 2 of the present invention;

FIGS. 5e–5g are plots of spherical aberration, astigmatism, and distortion, respectively, for Working Example 2 of the present invention;

FIGS. 7a–7d are plots of lateral chromatic aberration (tangential and sagittal) for various field heights Y for Working Example 3 of the present invention;

FIGS. 7e–7g are plots of spherical aberration, astigmatism, and distortion, respectively, for Working Example 3 of the present invention;

FIGS. 13a–13e are plots of lateral chromatic aberration (tangential and sagittal) for various field heights Y for Working Example 6 of the present invention;

FIGS. 15a–15e are plots of lateral chromatic aberration (tangential and sagittal) for various field heights Y for Working Example 7 of the present invention;

FIGS. 17a–17e are plots of lateral chromatic aberration (tangential and sagittal) for various field heights Y for Working Example 8 of the present invention;

FIGS. 19a–19e are plots of lateral chromatic aberration (tangential and sagittal) for various field heights Y for Working Example 9 of the present invention.

DETAILED DESCRIPTION OF THE INVENTION

The present invention relates to projection lenses and projection exposure apparatuses and exposure methods using same, and more particularly to high-performance dioptric reduction projection lenses suitable for ultra-violet and deep ultra-violet photolithography, and projection exposure apparatuses and exposure methods using same.

Figure 1:
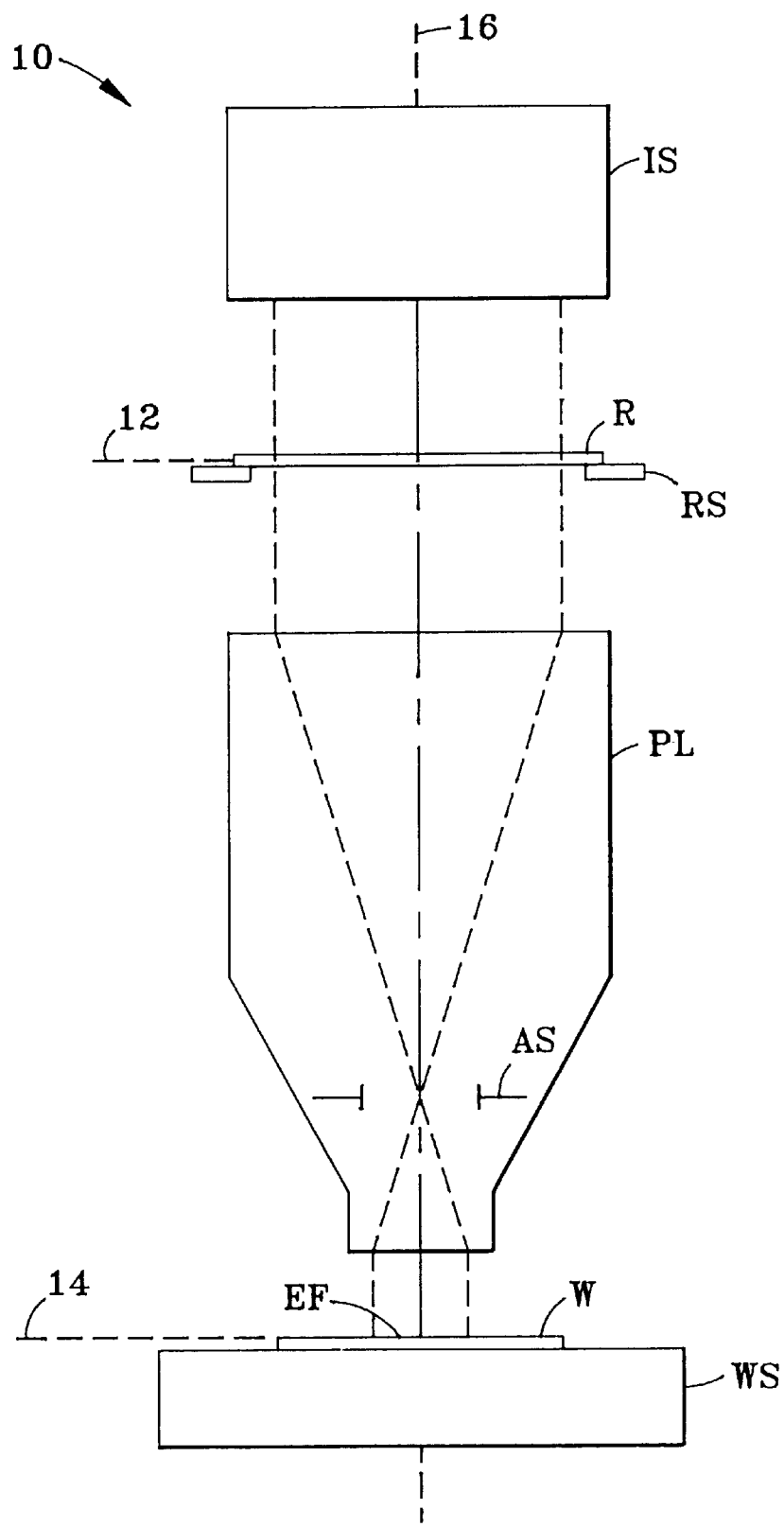
FIG. 1 is a schematic diagram of a projection exposure apparatus.

With reference to FIG. 1, projection exposure apparatus 10 includes a projection lens PL having an object 12, an image plane 14, an optical axis 16, and an aperture stop AS. A reticle R is disposed at or near object plane 12. Reticle R is typically a transparent substrate, such as quartz glass, and includes small (i.e., micron and sub-micron) features. Reticle R is held in place and moved into a position at or near object plane 12 by reticle stage RS. Disposed adjacent reticle R along optical axis 16 opposite projection lens PL is an illumination optical system IS. Illumination optical system IS is designed to uniformly illuminate reticle R and also to form a source image at aperture stop AS in the absence of reticle R (i.e., Kohler illumination). A workpiece W, such as a silicon wafer coated with photoresist, is disposed along optical axis 16 at or near image plane 14. Workpiece W is held in place and moved into position by a workpiece stage WS.

To pattern workpiece W with projection exposure apparatus 10, reticle R and workpiece W are moved into proper alignment using reticle stage RS and workpiece stage WS, respectively. Reticle R is then illuminated with illumination optical system IS for a certain amount of time. An image of the reticle features is projected onto workpiece W over an exposure field EF, via projection lens PL. Workpiece stage WS then moves an incremental amount and another exposure is made on workpiece W. The process is repeated until a desired area of workpiece W is exposed.

Figure 2:
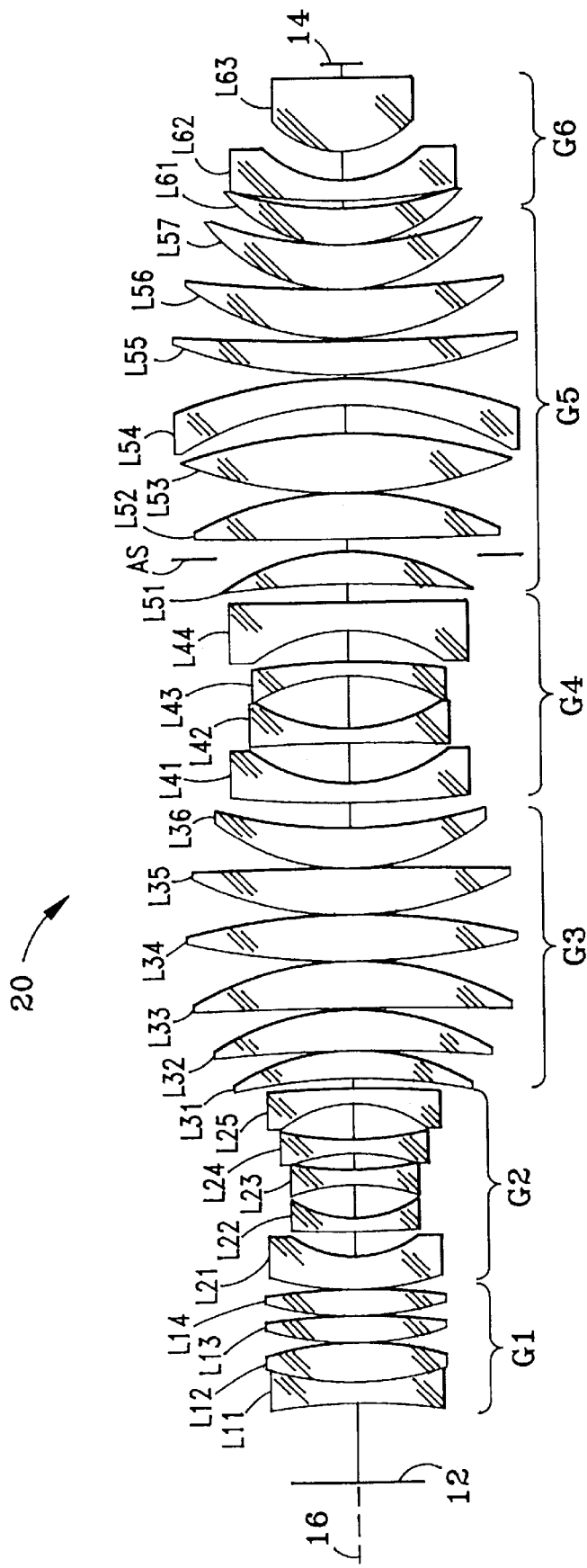
FIG. 2 is an optical diagram of Working Example 1 of the present invention.
Figure 3A:
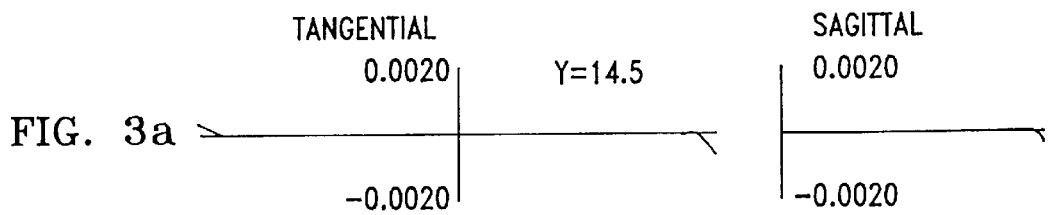
FIGS. 3a–3d are plots of lateral chromatic aberration (tangential and sagittal) for various field heights Y for Working Example 1 of the present invention.
Figure 3B:
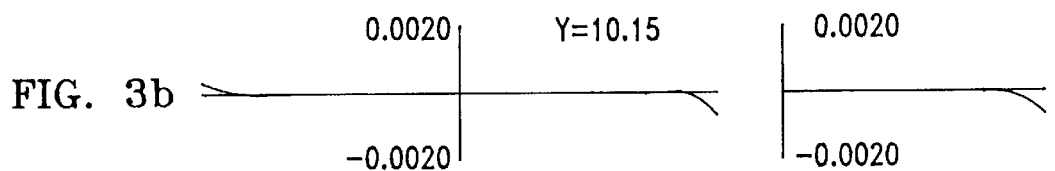
Figure 3C:
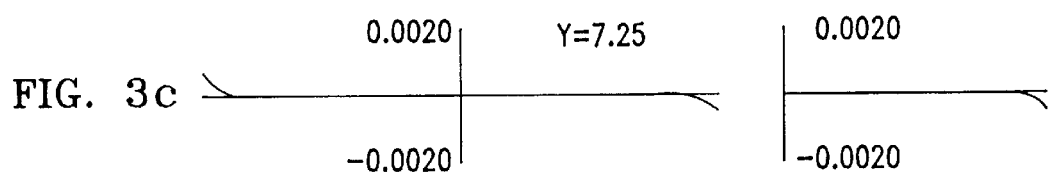
Figure 3D:
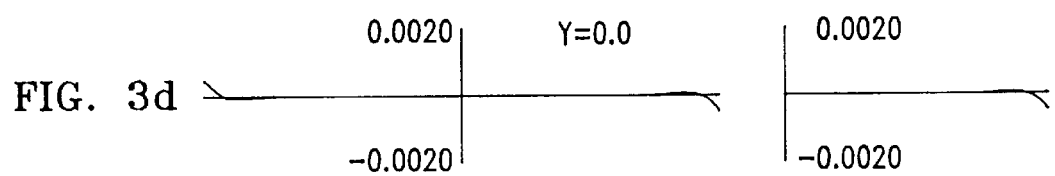
Figures 3E, 3F, 3G:
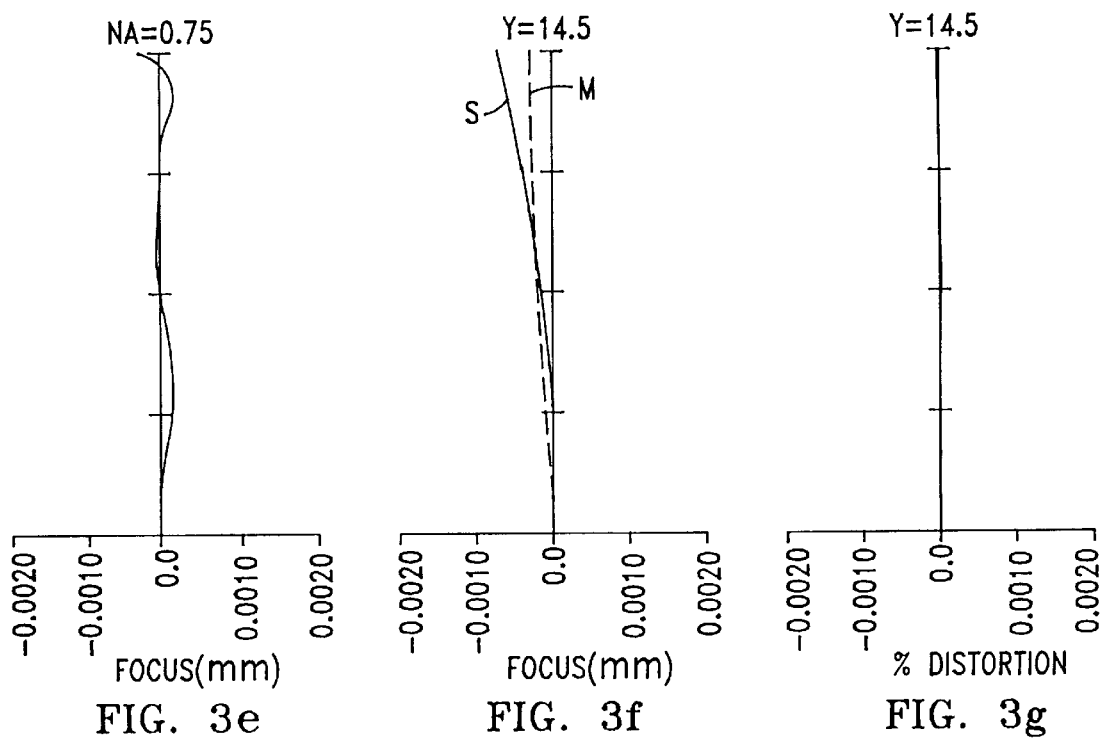
FIGS. 3e–3g are plots of spherical aberration, astigmatism, and distortion, respectively, for Working Example 1 of the present invention.

The heart of projection exposure apparatus 10 is projection lens PL. With reference to FIG. 2, which shows a representative projection lens 20, the projection lens of the present invention comprises objectwise to imagewise, a first lens group G1 having a positive refractive power, a second lens group G2 having a negative refractive power, a third lens group G3 having a positive refractive power, a fourth lens group G4 having a negative refractive power, a fifth lens group G5 having a positive refractive power, and a sixth lens group G6 having a positive refractive power.

First lens group G1 principally contributes to correcting of distortion while maintaining telecentricity. First lens group G1 also corrects the negative distortion produced by the lens groups. Second lens group G2 and third lens group G3 form a reverse telephoto system and contribute to shortening the overall length of the projection lens. The present invention also uses three or more lenses having a positive refractive power in third lens group G3 to satisfactorily correct coma produced by third lens group G3.

In addition, second lens group G2 and fourth lens group G4 principally contribute to correction of the Petzval sum, and thereby flatten the image plane. In particular, three or more lenses having a negative refractive power are used in fourth lens group G4 to make the Petzval sum approach zero. Fifth lens group G5 and sixth lens group G6 correct negative distortion, and contribute correcting spherical aberration arising from the increased NA on the image-plane side. Three or more lenses having a positive refractive power are used in fifth lens group G5 to correct spherical aberration.

Furthermore, field angle-related aberrations that tend to be problematic in high NA optical systems comprising only spherical lenses (particularly coma in the sagittal direction) can be corrected in the present invention by including an aspheric surface in fourth lens group G4. In particular, it is preferable to provide an aspheric concave surface that weakens the refractive power of the particular lens element in the vicinity of the optical axis.

In addition, by including an aspheric surface in fifth lens group G5, large NA-related aberrations, particularly high-order spherical aberrations, can be corrected. The same result is obtained using an aspheric surface in lens group G4 if the surface is sufficiently close to the image plane. In this case, if the aspheric surface is a convex, it should weaken the refractive power of the particular lens element in the vicinity of optical axis 16. If the aspheric surface is concave, then it should strengthen the refractive power of the particular lens element in the vicinity of optical axis 16. In other words, for the projection lens of the present invention to have a large NA and a large exposure region EF, it is preferable from the viewpoint of aberration correction that at least one lens element in either the fourth or fifth lens group includes at least one aspheric surface.

In addition, aberration correction is effective even if an aspheric surface is included in a lens group other than fourth lens group G4 or fifth lens group G5. For example, distortion can be corrected if an aspheric surface is included in first lens group G1. Moreover, entrance pupil aberrations (i.e., variations in entrance pupil position as a function of image height) can be reduced by including an aspheric surface in second lens group G2. In addition, if an aspheric surface is included in third lens group G3 or sixth lens group G6, coma can be corrected. Furthermore, even if some of the optical elements of the above-mentioned lens groups have no refractive power, e.g., plane parallel plates, satisfactory aberration correction can be obtained if they are made aspheric.

It is preferable in the present invention that one or more of the following design conditions be satisfied:

$$0.1 < f_1/f_3 < 15 \quad (1)$$
$$0.05 < f_2/f_4 < 6 \quad (2)$$
$$0.01 < f_5/L < 1.2 \quad (3)$$
$$0.02 < f_6/L < 1.8 \quad (4)$$

wherein, $f_1$ is the focal length of first lens group G1, $f_2$ is the focal length of second lens group G2, $f_3$ is the focal length of third lens group G3, $f_4$ is the focal length of fourth lens group G4, $f_5$ is the focal length of fifth lens group G5, $f_6$ is the focal length of sixth lens group G6, and L is the distance from object plane 12 to image plane 14 i.e., the overall lens length (see, e.g., FIG. 2).

Condition (1) stipulates the optimal ratio between focal length $f_1$ of first lens group G1 and focal length $f_3$ of third lens group G3. This condition is principally for the purpose of balancing distortion. If $f_1/f_3$ in condition (1) falls below the lower limit, a large negative distortion is produced due to the relative weakening of the refractive power of third lens group G3 with respect to the refractive power of first lens group G1. In addition, if $f_1/f_3$ in condition (1) exceeds the upper limit, a large negative distortion is produced due to the relative weakening of the refractive power of first lens group G1 with respect to the refractive power of third lens group G3.

Condition (2) stipulates the optimal ratio between focal length $f_2$ of second lens group G2 having a negative refractive power and focal length $f_4$ of fourth lens group G4 having negative refractive power. This condition is principally for the purpose of reducing the Petzval sum (nearly to zero) and correcting image plane distortion, while ensuring a large exposure region. If $f_2/f_4$ in condition (2) falls bellow the lower limit, a large positive Petzval sum is produced due to the relative weakening of the refractive power of fourth lens group G4 with respect to the refractive power of second lens group G2. If $f_2/f_4$ in condition (2) exceeds the upper limit, a large positive Petzval sum is produced due to the relative weakening of the refractive power of second lens group G2 with respect to the refractive power of fourth lens group G4.

Condition (3) stipulates the optimal refractive power of fifth lens group G5. This condition is for the purpose of correcting spherical aberration, distortion and Petzval sum, while maintaining a large NA. If $f_5/L$ in condition (3) falls below the lower limit, the refractive power of fifth lens group G5 becomes excessively large. This, in turn, produces negative distortion and a large amount of negative spherical aberration. If $f_5/L$ in condition (3) exceeds the upper limit, the refractive power of fifth lens group G5 becomes excessively weak. Consequently, the refractive power of fourth lens group G4 weakens and the Petzval sum remains large.

Condition (4) stipulates the optimal refractive power of sixth lens group G6. This condition is for the purpose of suppressing the generation of high-order spherical aberration and negative distortion while maintaining a large NA. If $f_6/L$ in condition (4) falls below the lower limit, a large negative distortion is produced. If $f_6/L$ in condition (4) exceeds the upper limit, an undesirable amount of high-order spherical aberration is produced.

In addition, it is preferable that fourth lens group G4 satisfy the following condition:

$$-0.3 < f_4/L < -0.005. \quad (5)$$

Condition (5) stipulates the optimal refractive power of fourth lens group G4. If $f_4/L$ in condition (5) falls below the lower limit, correction of spherical aberration becomes difficult. If $f_4/L$ in condition (5) exceeds the upper limit, an undesirable amount of coma is produced. To ensure correction of spherical aberration and the Petzval sum, it is preferable to set the lower limit of condition (5) to −0.078. Furthermore, to suppress the generation of coma, it is preferable to set the upper limit of condition (5) to −0.047.

Further, it is preferable that second lens group G2 satisfy the following condition:

$$-0.5 < f_2/L < -0.005. \quad (6)$$

Condition (6) stipulates the optimal refractive power of second lens group G2. If $f_2/L$ in condition (6) falls below the lower limit, the Petzval sum becomes a large positive value. If $f_2/L$ in condition (6) exceeds the upper limit, negative distortion is produced. Furthermore, to more ensure correction of the Petzval sum, it is preferable to set the lower limit of condition (6) to −0.16. Also, to more ensure correction of negative distortion and coma, it is preferable to set the upper limit of condition (6) to −0.0710.

Furthermore, to correct the Petzval sum and distortion, it is preferable that second lens group G2 include at least three lenses each having negative refractive power, and that the following condition is satisfied:

$$-0.3 < f_2n/L < -0.01 \quad (7)$$

wherein the composite focal length from the third lens (L23) through the fifth lens (L25) in second lens group G2 is given as $f_2n$ (see FIG. 2). If $f_2n/L$ in condition (7) falls below the lower limit, the Petzval sum becomes a large positive value. If $f_2n/L$ in condition (7) exceeds the upper limit, negative distortion is produced.

In addition, it is preferable that fifth lens group G5 includes a negative meniscus lens, and that this lens element satisfy the following condition:

$$0.1 < |R_5n|/L < 0.5 \quad (8)$$

wherein the radius of curvature of the concave surface of the negative meniscus lens (L54) in fifth lens group G5 is given as $R_5n$ (see FIG. 2). High-order spherical aberration associated with a large NA can be corrected by having at least one negative meniscus lens element in fifth lens group G5. If $|R_5n|$ in condition (8) falls below the lower limit, a large amount of "over-correcting" spherical aberration is generated. If $|R_5n|/L$ in condition (8) exceeds the upper limit, a large amount of "under-correcting" spherical aberration is generated. In order to ensure correction of spherical aberration, it is preferable to set the upper limit of condition (8) to 0.3, and the lower limit to 0.15.

Furthermore, it is preferable that sixth lens group G6 includes a negative meniscus lens element, and that this lens element satisfy the following condition:

$$0.03 < |R_6n|/L < 0.15 \quad (9)$$

wherein the radius of curvature of the concave surface of the negative meniscus lens (L62) in sixth lens group G6 is given as $R_6n$ (see FIG. 2). Negative spherical aberration and negative distortion generated by the positive lens (L63) in sixth lens group G6 can be corrected by having at least one negative meniscus lens in the sixth lens group. If $|R_6n|/L$ in condition (9) falls below the lower limit, correcting both distortion and spherical aberration becomes difficult. If $|R_6n|/L$ in condition (9) exceeds the upper limit, a large amount of coma is generated. To ensure correction these aberrations, it is preferable to set the lower limit of condition (9) to 0.05.

In addition, it is preferable that first lens group G1 include a lens element having negative refractive power, and that this lens element it satisfy the following condition:

$$0.1 < |R_1 n|/L < 0.5 \quad (10)$$

wherein the radius of curvature on the image plane side of the lens having a negative refractive power (L11) in first lens group G1 is given as $R_1 n$ (See FIG. 2). If $|R_1 n|/L$ in condition (10) falls below the lower limit, a large negative distortion is generated. If $|R_1 n|/L$ in condition (10) exceeds the upper limit, correction of field curvature becomes difficult.

WORKING EXAMPLES

Working Examples 1–9 of the present invention are set forth in detail below in Tables 1a–c through Tables 9a–c, and in FIGS. 2, 4, 6, 8, 10, 12, 14, 16, and 18, along with their corresponding aberration plots (FIGS. 3a–g, 5a–g, 7a–g, 9a–g, 11a–g, 13a–h, 15a–h, 17a–h, and 19a–h). In the aberration plots for astigmatism (FIGS. 3f, 5f, 7f, 9f, 11f, 13g, 15g, 17g and 19g), the solid line S represents the sagittal image plane, and the broken line M represents the meridional image plane.

In the Figures and Tables below, the following variables, in addition to those defined in the above conditions and equations, are used:

n=refractive index at 248.4 nm;

S=surface number;

r=radius of curvature of a lens element surface with a positive value having the center of curvature to the right of the lens surface;

d=distance between adjacent lens surfaces;

Y=field height;

Also, an aspherical surface is expressed by the equation $$S(y)=(cy^2)/(1+(1-(1+\kappa)c^2y^2)^{1/2})+Ay^4+By^6+Cy^8+Dy^{10}+Ey^{12}+Fy^{14}+Gy^{16} \quad [\text{eq. 9}]$$

wherein

κ=conic constant;

S(y)=sag of optical surface at height y; and

A–G=aspherical coefficients;

The aspheric surface data are provided in Tables 1b–9b. Also, the direction from object to image is positive.

Working Example 1

Projection lens 20 of FIG. 2 represents Working Example 1 and comprises, from object plane 12 to image plane 14, a A first lens group G1 comprising a biconvex lens element L11, a biconvex lens element L12, a biconvex lens element L13, and a biconvex lens element L14. Next is a second lens group G2 comprising a negative meniscus lens element L21 having an objectwise convex surface, a negative meniscus lens element L22 having an objectwise convex surface, a biconcave lens element L23, a biconcave lens element L24, and a negative meniscus lens element L25 having an objectwise concave surface. Next is third lens group G3 comprising a positive meniscus lens element L31 having an objectwise concave surface, a positive meniscus lens element L32 having an objectwise concave surface, a positive meniscus lens element L33 having an objectwise concave surface, a biconvex lens element L34, a biconvex lens element L35, and a positive meniscus lens element L36 having an objectwise convex surface. Next is a lens group G4 comprising a negative meniscus lens element L41 having an objectwise convex surface, a biconcave element L42, a negative meniscus lens element L43 having an objectwise concave surface, and a negative meniscus lens element L44 having an objectwise concave surface. Next is lens group G5 comprising a positive meniscus lens element L51 having an objectwise concave surface, a biconvex element L52, a biconvex lens element L53, a negative meniscus lens element L54 having an objectwise concave surface, a positive meniscus lens element L55 having an objectwise convex surface, and a positive meniscus lens element L56 having an objectwise convex surface, a positive meniscus lens element L57 having an objectwise convex surface. Next is lens group G6 comprising a positive meniscus lens element L61 having an objectwise convex surface, a negative meniscus lens element L62 having an objectwise convex surface, and a positive meniscus lens element L63 having an objectwise convex surface. Aperture stop AS is disposed between lens elements L51 and L52 in lens group G5.

In projection lens 20 of FIG. 2, the NA is 0.75, the magnification is 1/4, L is 1,200, the on-axis distance from object plane 12 to the most objectwise surface of lens L11 is 60.0, the back focal length is 12.805970, and the maximum image height is 14.5.

TABLE 1a

| S | r | d | n | Group |
|---|---|---|---|---|
| 1 | −552.07638 | 18.000000 | 1.50839 | G1 |
| 2 | 265.90878 | 3.120094 | | |
| 3 | 303.56674 | 25.392455 | 1.50839 | |
| 4 | −350.79337 | 0.500000 | | |
| 5 | 290.31959 | 23.811936 | 1.50839 | |
| 6 | −624.97721 | 0.500000 | | |
| 7 | 312.56146 | 21.494338 | 1.50839 | |
| 8 | −797.18857 | 0.500000 | | |
| 9 | 261.54552 | 29.172376 | 1.50839 | G2 |
| 10 | 125.42248 | 18.785151 | | |
| 11 | 624.94963 | 13.000000 | 1.50839 | |
| 12 | 168.74192 | 19.573060 | | |
| 13 | −425.29079 | 13.000000 | 1.50839 | |
| 14 | 305.76133 | 20.876454 | | |
| 15 | −199.33811 | 13.000000 | 1.50839 | |
| 16 | 856.47160 | 28.817472 | | |
| 17 | −133.88550 | 13.515883 | 1.50839 | |
| 18 | −1224.09463 | 12.256929 | | |
| 19 | −424.87732 | 25.795588 | 1.50839 | G3 |
| 20 | −190.54844 | 1.165877 | | |
| 21 | −1188.77588 | 34.579068 | 1.50839 | |
| 22 | −245.12631 | 0.500000 | | |
| 23 | −17375.73600 | 39.303374 | 1.50839 | |
| 24 | −300.00000 | 0.500000 | | |
| 25 | 619.48904 | 39.230416 | 1.50839 | |
| 26 | −600.00000 | 0.500000 | | |
| 27 | 333.78553 | 38.548189 | 1.50839 | |
| 28 | −3403.39561 | 0.834915 | | |
| 29 | 200.00000 | 35.678083 | 1.50839 | |
| 30 | 595.18114 | 18.729269 | | |
| 31 | 1345.40672 | 15.064622 | 1.50839 | G4 |
| 32 | 150.40751 | 33.035337 | | |
| 33 | −2376.89219 | 13.177083 | 1.50839 | |
| 34 | 153.73077 | 46.252835 | | |
| 35 | −154.61578 | 13.177083 | 1.50839 | |
| 36 | −693.63984 | 27.484948 | | |
| 37 | −151.27474 | 23.185494 | 1.50839 | |
| 38 | −41891.41764 | 18.186222 | | |
| 39 | −780.08694 | 25.875000 | 1.50839 | G5 |
| 40 | −216.11014 | 2.191161 | | |
| 41 | 0.00000 | 12.650000 | | |
| 42 | 11593.32693 | 39.563021 | 1.50839 | |
| 43 | −286.19552 | 0.500000 | | |
| 44 | 449.04044 | 49.373870 | 1.50839 | |
| 45 | −449.10638 | 19.592109 | | |
| 46 | −285.87741 | 21.961806 | 1.50839 | |
| 47 | −400.00000 | 4.525940 | | |
| 48 | 404.59626 | 28.919442 | 1.50839 | |
| 49 | 2500.00000 | 3.401017 | | |
| 50 | 278.77327 | 34.590495 | 1.50839 | |

TABLE 1a-continued

| S | r | d | n | Group |
|---|---|---|---|---|
| 51 | 1210.33063 | 0.500000 | | |
| 52 | 161.00000 | 37.613837 | 1.50839 | |
| 53 | 344.55156 | 1.726253 | | |
| 54 | 149.63156 | 28.524224 | 1.50839 | G6 |
| 55 | 292.14056 | 9.604067 | | |
| 56 | 550.00000 | 13.000000 | 1.50839 | |
| 57 | 88.88938 | 27.500000 | | |
| 58 | 85.56699 | 65.287238 | 1.50839 | |
| 59 | 492.74526 | | | |

TABLE 1b

ASPHERIC SURFACE DATA

S34 κ = 0.090293    A = −.697976E − 08    B = −.581788E − 12    C = −.238374E − 16
///   D = −.634191E − 21
S39 κ = 4.380884    A = −.197323E − 08    B = 0.451378E − 13    C = −.151975E − 17
///   D = 0.174755E − 21    E = −.741606E − 26    F = 0.143029E − 30    G = −.390455E − 36

TABLE 1C

DESIGN PARAMETERS

| Parameter | Value |
|---|---|
| $f_1/f_3$ | 1.622 |
| $f_2/f_4$ | 0.960 |
| $f_5/L$ | 0.116 |
| $f_6/L$ | 0.351 |
| $f_4/L$ | −0.050 |
| $f_2/L$ | −0.048 |
| $f_2 n/L$ | −0.093 |
| $|R_5 n|/L$ | 0.238 |
| $|R_6 n|/L$ | 0.074 |
| $|R_1 n|/L$ | 0.222 |

As is clear from the aberration plots of FIGS. 3a–3g, the configuration of this Working Example is well-corrected for aberrations and is suitable for achieving the objectives of the present invention.

Working Example 2

Figure 4:
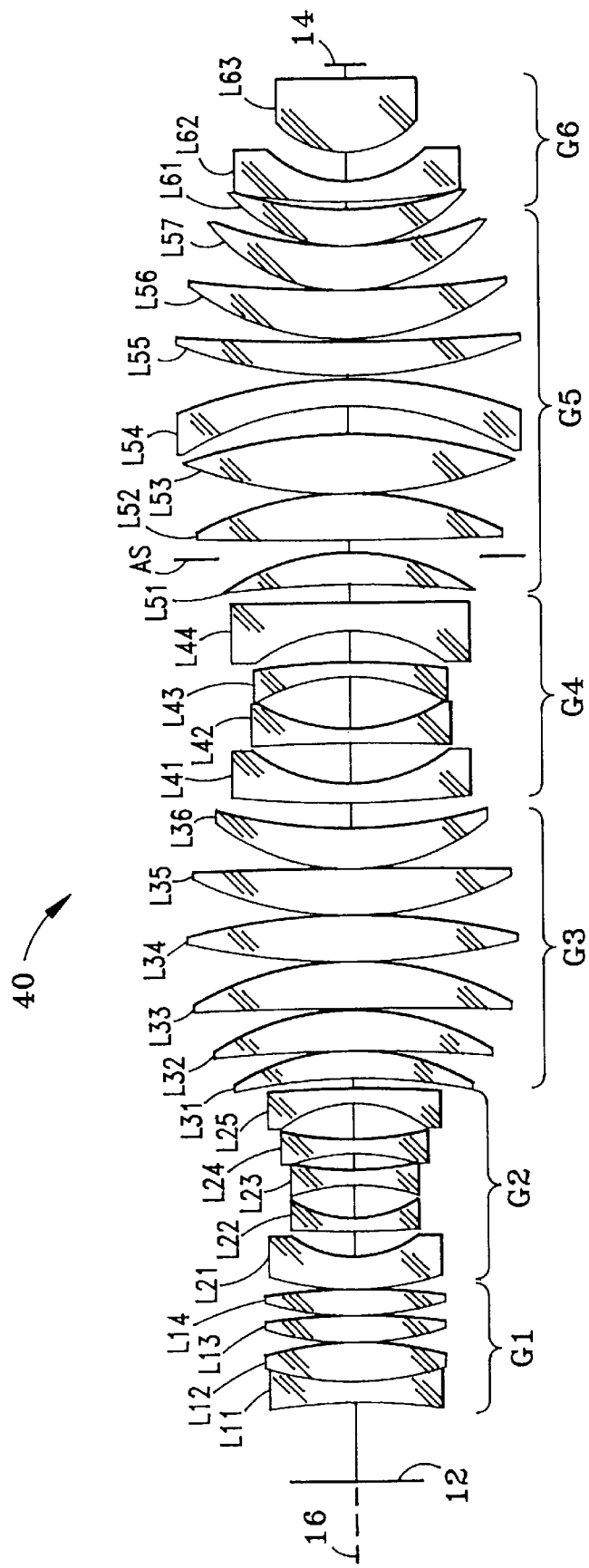
FIG. 4 is an optical diagram of Working Example 2 of the present invention.

Projection lens 40 of FIG. 4 represents Working Example 2 and comprises the same number and type of lens elements as described above in connection with projection lens 20 of Working Example 1. In projection lens 40, the NA is 0.75, the magnification is 1/4, L is 1,200, the distance from object plane 12 to the most objectwise surface of lens element L11 is 60.0, the back focal length is 14.728158, and the maximum image height is 14.5.

TABLE 2a

| S | r | d | n | Group |
|---|---|---|---|---|
| 1 | −417.40181 | 18.000000 | 1.50839 | G1 |
| 2 | 294.54444 | 3.333675 | | |
| 3 | 334.45870 | 24.993761 | 1.50839 | |
| 4 | −339.46258 | 0.500000 | | |
| 5 | 388.46405 | 22.695257 | 1.50839 | |
| 6 | −475.96837 | 0.500000 | | |
| 7 | 261.49728 | 22.822544 | 1.50839 | |
| 8 | −1115.97742 | 0.500000 | | |
| 9 | 212.83142 | 29.172376 | 1.50839 | G2 |

TABLE 2a-continued

| S | r | d | n | Group |
|---|---|---|---|---|
| 10 | 124.37798 | 17.392876 | | |
| 11 | 398.03023 | 13.000000 | 1.50839 | |
| 12 | 147.41084 | 19.332678 | | |
| 13 | −791.18158 | 13.000000 | 1.50839 | |
| 14 | 201.19761 | 21.922400 | | |
| 15 | −247.90314 | 13.000000 | 1.50839 | |
| 16 | 465.71573 | 30.747889 | | |
| 17 | −130.57945 | 13.011599 | 1.50839 | |
| 18 | −934.63444 | 12.339136 | | |
| 19 | −407.40602 | 25.381972 | 1.50839 | G3 |

TABLE 2a-continued

| S | r | d | n | Group |
|---|---|---|---|---|
| 20 | −188.40893 | 1.223561 | | |
| 21 | −1400.47996 | 34.176948 | 1.50839 | |
| 22 | −252.53836 | 0.500000 | | |
| 23 | −17379.23724 | 39.131937 | 1.50839 | |
| 24 | −300.00000 | 0.500000 | | |
| 25 | 606.80606 | 39.230416 | 1.50839 | |
| 26 | −600.00000 | 0.500000 | | |
| 27 | 353.9651 | 38.782843 | 1.50839 | |
| 28 | −2125.11370 | 2.168618 | | |
| 29 | 208.12823 | 34.974979 | 1.50839 | |
| 30 | 681.68307 | 18.204990 | | |
| 31 | 1293.20817 | 14.087040 | 1.50839 | G4 |
| 32 | 150.44667 | 33.112502 | | |
| 33 | −2376.89219 | 13.177083 | 1.50839 | |
| 34 | 157.22015 | 46.101506 | | |
| 35 | −155.71365 | 13.177083 | 1.50839 | |
| 36 | −849.18622 | 27.476866 | | |
| 37 | −152.68796 | 20.775187 | 1.50839 | |
| 38 | −8671.69720 | 16.726849 | | |
| 39 | −661.58711 | 25.875000 | 1.50839 | G5 |
| 40 | −204.76811 | 2.156136 | | |
| 41 | 0.00000 | 12.650000 | | |
| 42 | 5120.14440 | 41.798891 | 1.50839 | |
| 43 | −294.95271 | 0.500000 | | |
| 44 | 446.90928 | 49.373870 | 1.50839 | |
| 45 | −451.25900 | 18.201385 | | |
| 46 | −280.36427 | 21.961806 | 1.50839 | |
| 47 | −400.00000 | 4.804497 | | |
| 48 | 387.56604 | 34.446973 | 1.50839 | |
| 49 | 2500.00000 | 4.429387 | | |
| 50 | 273.26334 | 35.779749 | 1.50839 | |
| 51 | 1264.70932 | 0.500000 | | |
| 52 | 161.00000 | 35.902736 | 1.50839 | |
| 53 | 324.49673 | 0.500000 | | |
| 54 | 144.97966 | 30.031914 | 1.50839 | G6 |
| 55 | 292.80624 | 9.288710 | | |
| 56 | 550.00000 | 13.000000 | 1.50839 | |
| 57 | 88.32098 | 26.733677 | | |
| 58 | 86.45884 | 61.662542 | 1.50839 | |
| 59 | 502.09604 | | | |

TABLE 2b

ASPHERIC SURFACE DATA

| S16 | $\kappa = -2.932132$ | $A = -.264382E - 08$ | $B = -.678762E - 12$ | $C = -.836895E - 17$ |
|---|---|---|---|---|
| /// | $D = -.537613E - 21$ | | | |
| S34 | $\kappa = 0.122316$ | $A = -.747792E - 08$ | $B = -.577389E - 12$ | $C = -.256679E - 16$ |
| /// | $D = -.256545E - 21$ | | | |
| S39 | $\kappa = 2.181635$ | $A = -.108977E - 08$ | $B = 0.154837E - 13$ | $C = -.107182E - 17$ |
| /// | $D = 0.935404E - 22$ | $E = 0.174717E - 26$ | $F = -.388438E - 30$ | $G = 0.118356E - 34$ |

TABLE 2c

DESIGN PARAMETERS

| Parameter | Value |
|---|---|
| $f_1/f_3$ | 1.666 |
| $f_2/f_4$ | 1.000 |
| $f_5/L$ | 0.117 |
| $f_6/L$ | 0.349 |
| $f_4/L$ | -0.050 |
| $f_2/L$ | -0.050 |
| $f_2 n/L$ | -0.090 |
| $|R_5 n|/L$ | 0.234 |
| $|R_6 n|/L$ | 0.074 |
| $|R_1 n|/L$ | 0.245 |

As is clear from the aberration plots of FIGS. 5a–5g, the configuration of this Working Example is well-corrected for aberrations and is suitable for achieving the objectives of the present invention.

Working Example 3

Figure 6:
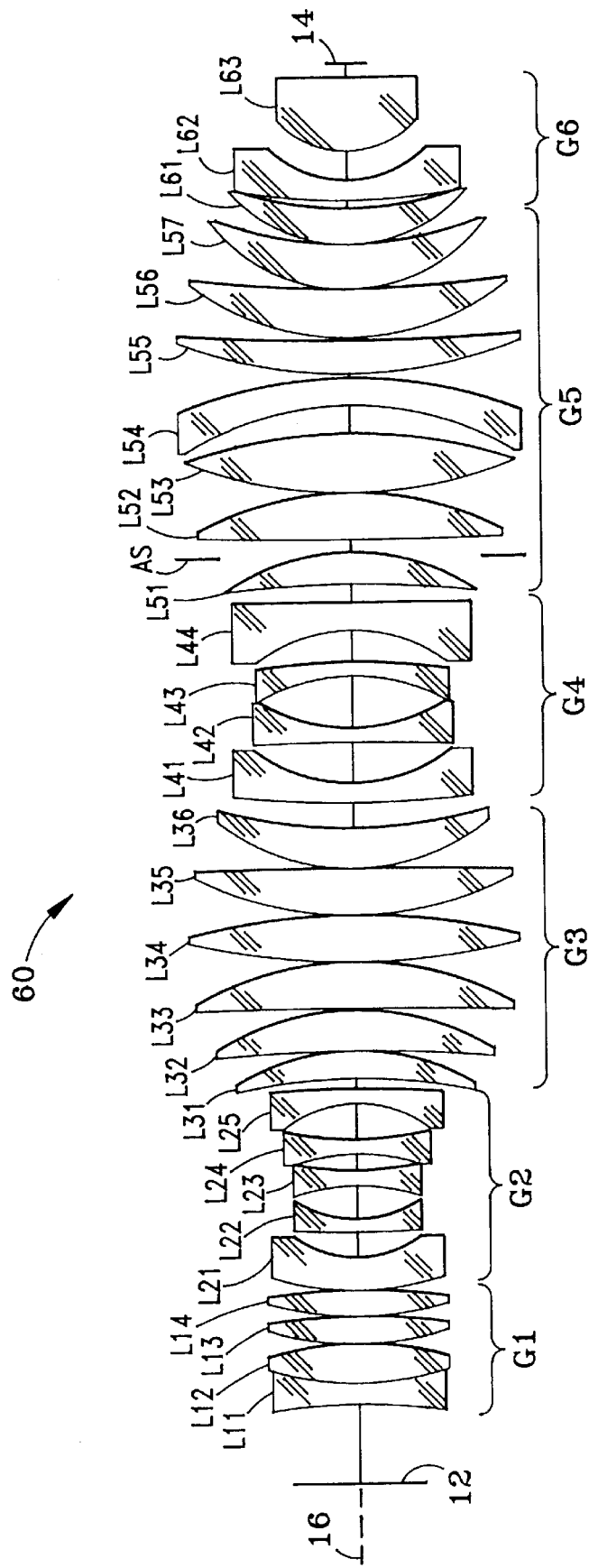
FIG. 6 is an optical diagram of Working Example 3 of the present invention.

Projection lens 60 of FIG. 6 represents Working Example 3 and comprises the same number and type of lens elements as described above in connection with projection lens 20 of Working Example 1. In projection lens 60, the NA is 0.75, the magnification is 1/4, L is 1,200, the distance from object plane 12 to the most objectwise surface of lens element L11 is 60.0, the back focal length is 14.571124, and the maximum image height is 14.5.

TABLE 3a

| S | r | d | n | Group |
|---|---|---|---|---|
| 1 | -444.41905 | 18.000000 | 1.50839 | G1 |
| 2 | 263.95589 | 3.115278 | | |
| 3 | 306.30710 | 25.595388 | 1.50839 | |
| 4 | -353.72876 | 0.500000 | | |
| 5 | 401.53161 | 22.629592 | 1.50839 | |
| 6 | -458.32974 | 0.500000 | | |
| 7 | 260.42411 | 22.384483 | 1.50839 | |
| 8 | -1332.14165 | 0.500000 | | |
| 9 | 201.56696 | 29.172376 | 1.50839 | G2 |
| 10 | 123.44572 | 17.498236 | | |
| 11 | 391.40156 | 13.000000 | 1.50839 | |
| 12 | 148.83020 | 19.339575 | | |
| 13 | -756.35940 | 13.000000 | 1.50839 | |
| 14 | 199.64333 | 21.883300 | | |
| 15 | -251.99565 | 13.000000 | 1.50839 | |
| 16 | 457.35347 | 30.933422 | | |
| 17 | -130.24344 | 13.000000 | 1.50839 | |
| 18 | -920.27012 | 12.350072 | | |
| 19 | -409.12942 | 25.374524 | 1.50839 | G3 |
| 20 | -188.90615 | 1.181273 | | |
| 21 | -1424.75959 | 34.047906 | 1.50839 | |
| 22 | -253.26753 | 0.500000 | | |
| 23 | -17379.22377 | 39.132597 | 1.50839 | |
| 24 | -300.00000 | 0.500000 | | |
| 25 | 606.80606 | 39.230416 | 1.50839 | |
| 26 | -600.00000 | 0.500000 | | |
| 27 | 354.99225 | 38.635587 | 1.50839 | |
| 28 | -2087.99596 | 2.226818 | | |
| 29 | 207.60159 | 35.002784 | 1.50839 | |
| 30 | 675.59635 | 18.256602 | | |
| 31 | 1287.29080 | 14.110578 | 1.50839 | G4 |
| 32 | 150.42360 | 33.005885 | | |
| 33 | -2376.89219 | 13.177083 | 1.50839 | |
| 34 | 157.03647 | 46.068055 | | |
| 35 | -155.91252 | 13.177083 | 1.50839 | |
| 36 | -866.58591 | 27.490041 | | |
| 37 | -153.16663 | 20.801532 | 1.50839 | |
| 38 | -8493.66686 | 16.758746 | | |
| 39 | -660.86379 | 25.875000 | 1.50839 | G5 |
| 40 | -205.11225 | 2.176870 | | |
| 41 | 0.00000 | 12.650000 | | |
| 42 | 4630.94239 | 0.000000 | 1.50839 | |
| 43 | -296.67705 | 0.612232 | | |
| 44 | 450.13834 | 49.373870 | 1.50839 | |
| 45 | -448.11047 | 18.090639 | | |
| 46 | -280.56579 | 21.961806 | | |
| 47 | -400.00000 | 4.069219 | | |
| 48 | 387.42237 | 34.838224 | 1.50839 | |
| 49 | 2500.00000 | 4.694122 | | |
| 50 | 273.67184 | 35.838683 | 1.50839 | |
| 51 | 1255.46173 | 0.539463 | | |
| 52 | 161.00000 | 35.919890 | 1.50839 | |
| 53 | 325.11630 | 0.500000 | | |
| 54 | 144.91170 | 30.069410 | 1.50839 | |
| 55 | 293.52341 | 9.245852 | | G6 |
| 56 | 550.00000 | 13.000000 | 1.50839 | |
| 57 | 88.42714 | 26.801733 | | |
| 58 | 86.53412 | 61.790454 | 1.50839 | |
| 59 | 498.55162 | | | |

TABLE 3b

ASPHERIC SURFACE DATA

| | | | | |
|---|---|---|---|---|
| S3 | $\kappa = 0.651961$ | $A = 0.288809E-08$ | $B = -.142241E-12$ | $C = 0.138026E-16$ |
| /// | $D = -.260214E-20$ | $E = 0.163779E-24$ | $F = 0.112908E-28$ | $G = -.964063E-33$ |
| S16 | $\kappa = -2.416851$ | $A = -.203332E-08$ | $B = -.639430E-12$ | $C = -.155725E-16$ |
| /// | $D = -.489171E-22$ | | | |
| S34 | $\kappa = -0.129246$ | $A = -.729364E-08$ | $B = -.586956E-12$ | $C = -.260844E-16$ |
| /// | $D = -.284984E-21$ | | | |
| S39 | $\kappa = 2.269617$ | $A = -.113325E-08$ | $B = 0.135572E-13$ | $C = -.115763E-17$ |
| /// | $D = 0.101617E-21$ | $E = 0.188022E-27$ | $F = -.278178E-30$ | $G = 0.871254E-35$ |

TABLE 3c

DESIGN PARAMETERS

| Parameter | Value |
|---|---|
| $f_1/f_3$ | 1.705 |
| $f_2/f_4$ | 1.017 |
| $f_5/L$ | 0.117 |
| $F_6/L$ | 0.349 |
| $f_4/L$ | -0.050 |
| $f_2/L$ | -0.051 |
| $f_2 n/L$ | -0.091 |
| $|R_5 n|/L$ | 0.234 |
| $|R_6 n|/L$ | 0.074 |
| $|R_1 n|/L$ | 0.220 |

As is clear from the aberration plots of FIGS. 7a–7g, the configuration of this Working Example is well-corrected for aberrations and is suitable for achieving the objectives of the present invention.

Working Example 4

Figure 8:
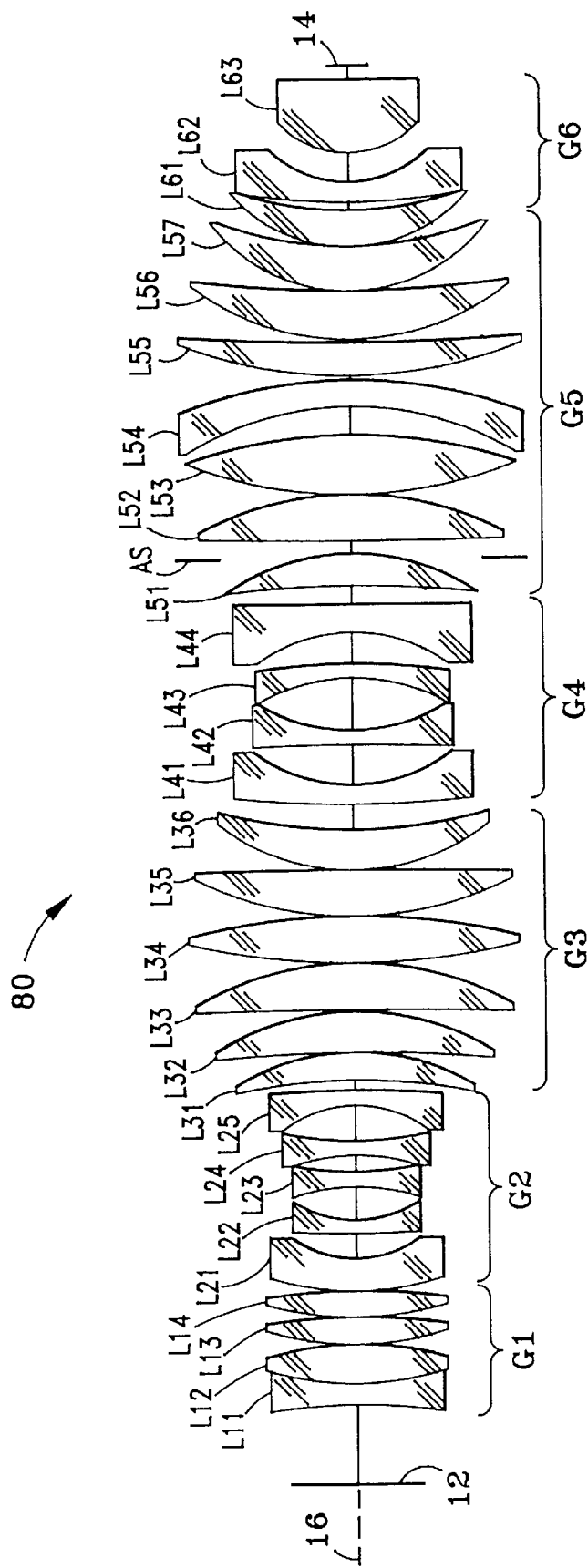
FIG. 8 is an optical diagram of Working Example 4 of the present invention.
Figure 9A:
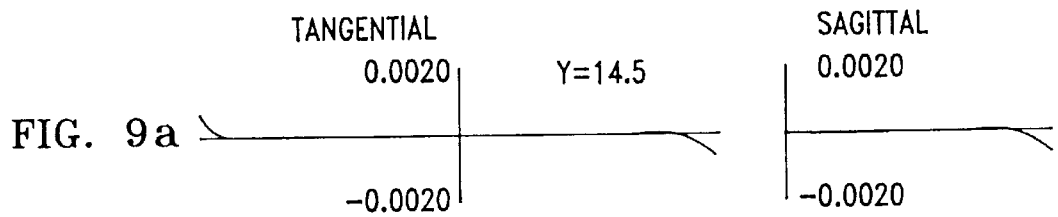
FIGS. 9a–9d are plots of lateral chromatic aberration (tangential and sagittal) for various field heights Y for Working Example 4 of the present invention.
Figure 9B:
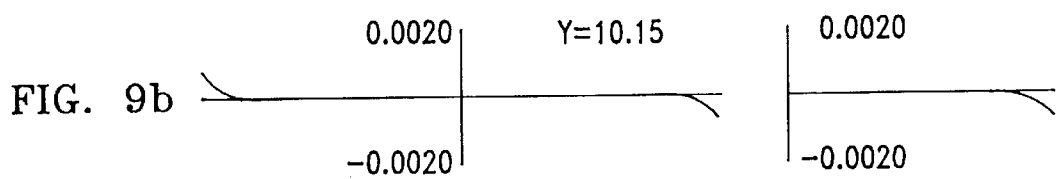
Figure 9C:
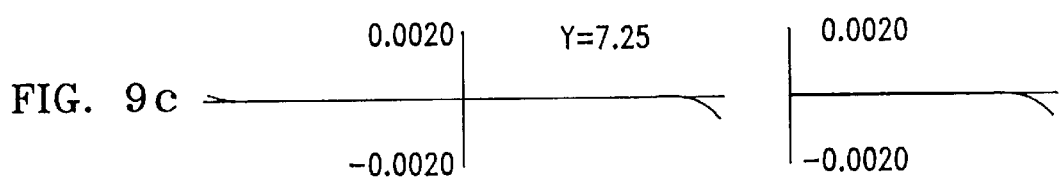
Figure 9D:
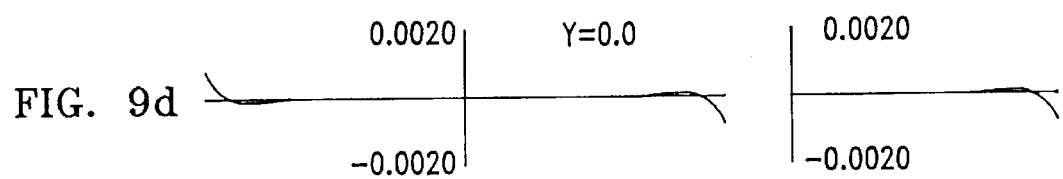
Figure 9E:
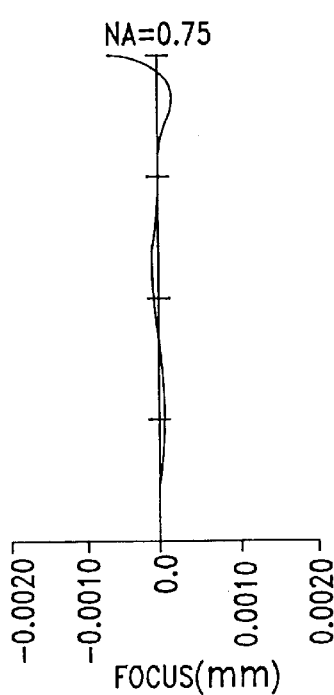
FIGS. 9e–9g are plots of spherical aberration, astigmatism, and distortion, respectively, for Working Example 4 of the present invention.
Figure 9F:
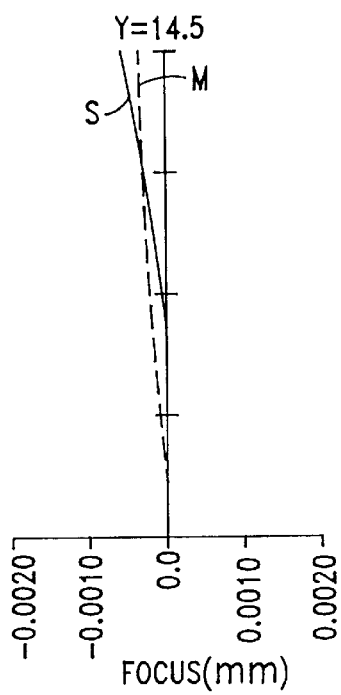
Figure 9G:
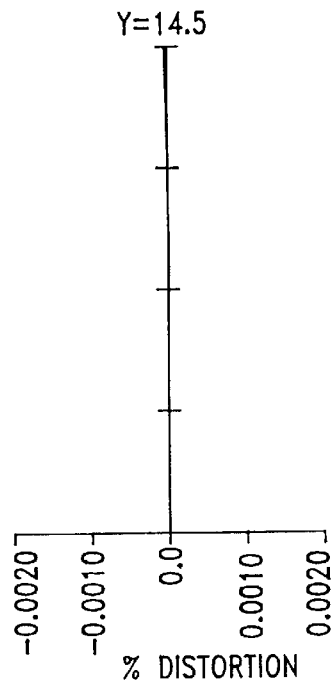

Projection lens 80 of FIG. 8 represents Working Example 4 and comprises the same number and type of lens elements as described above in connection with projection lens 20 of Working Example 1. In projection lens 80, the NA is 0.75, the magnification is 1/4, L is 1,200, the distance from object plane 12 to the most objectwise surface of lens element L11 is 60.0, the back focal length is 14.412672, and the maximum image height is 14.5.

TABLE 4a

| S | r | d | n | Group |
|---|---|---|---|---|
| 1 | -468.68095 | 18.000000 | 1.50839 | G1 |
| 2 | 252.77895 | 3.233640 | | |
| 3 | 298.24991 | 25.839827 | 1.50839 | |
| 4 | -360.06032 | 0.500000 | | |
| 5 | 417.93565 | 22.562122 | 1.50839 | |
| 6 | -441.51797 | 0.500000 | | |
| 7 | 263.82049 | 22.126107 | 1.50839 | |
| 8 | -1375.42189 | 0.500000 | | |
| 9 | 198.61141 | 29.172376 | 1.50839 | G2 |
| 10 | 125.13733 | 17.593360 | | |
| 11 | 416.27288 | 13.000000 | 1.50839 | |
| 12 | 154.18091 | 19.238100 | | |
| 13 | -668.92020 | 13.000000 | 1.50839 | |
| 14 | 199.41335 | 21.813538 | | |
| 15 | -256.36164 | 13.000000 | 1.50839 | |
| 16 | 444.96150 | 31.095384 | | |
| 17 | -130.59220 | 13.000000 | 1.50839 | |
| 18 | -921.24542 | 12.380140 | | |
| 19 | -411.14738 | 25.384580 | 1.50839 | G3 |
| 20 | -189.32775 | 1.174238 | | |
| 21 | -1445.99115 | 33.93471 | 1.50839 | |
| 22 | -253.88856 | 0.500000 | | |
| 23 | -17379.37023 | 39.125426 | 1.50839 | |
| 24 | -300.00000 | 0.500000 | | |
| 25 | 596.09906 | 39.230416 | 1.50839 | |
| 26 | -610.85050 | 0.500000 | | |
| 27 | 355.24038 | 38.551690 | 1.50839 | |
| 28 | -2079.35584 | 2.303654 | | |
| 29 | 207.42218 | 35.035451 | 1.50839 | |
| 30 | 673.51306 | 18.314100 | | |
| 31 | 1277.16954 | 14.138411 | 1.50839 | G4 |
| 32 | 150.32702 | 32.930730 | | |
| 33 | -2376.89219 | 13.177083 | 1.50839 | |
| 34 | 156.56831 | 46.042396 | | |
| 35 | -155.65637 | 13.177083 | 1.50839 | |
| 36 | -845.75387 | 27.494867 | | |
| 37 | -151.25828 | 20.850589 | 1.50839 | |
| 38 | -4346.25296 | 16.782509 | | |
| 39 | -616.9934 | 25.875000 | 1.50839 | G5 |
| 40 | -202.18912 | 2.221807 | | |
| 41 | INFINITY | 12.650000 | | |
| 42 | 4310.61591 | 41.857209 | 1.50839 | |
| 43 | -298.03165 | 0.760827 | | |
| 44 | 448.01359 | 49.373870 | 1.50839 | |
| 45 | -450.13834 | 18.123926 | | |
| 46 | -280.66611 | 21.961806 | 1.50839 | |
| 47 | -400.00000 | 3.771463 | | |
| 48 | 388.15249 | 35.013919 | 1.50839 | |
| 49 | 2500.00000 | 4.945986 | | |
| 50 | 274.68742 | 35.755123 | 1.50839 | |
| 51 | 1268.22336 | 0.500000 | | |
| 52 | 161.00000 | 35.804931 | 1.50839 | |
| 53 | 325.39957 | 0.500000 | | |
| 54 | 144.80153 | 30.033841 | 1.50839 | G6 |
| 55 | 293.86133 | 9.204704 | | |
| 56 | 550.00000 | 13.000000 | 1.50839 | |
| 57 | 89.52230 | 26.819022 | | |
| 58 | 87.53044 | 61.711363 | 1.50839 | |
| 59 | 495.57398 | | | |

TABLE 4b

ASPHERIC SURFACE DATA

| | | | | |
|---|---|---|---|---|
| S3 | κ = 0.965373 | A = 0.469769E − 08 | B = −.190197E − 12 | C = 0.112631E − 16 |
| /// | D = .355099E − 20 | E = 0.709289E − 24 | F = −.916514E − 28 | G = 0.586833E − 32 |
| S16 | κ = −2.033092 | A = −.153014E − 08 | B = −.574525E − 12 | C = −.170686E − 16 |
| /// | D = 0.650293E − 21 | | | |
| S30 | κ = −0.023006 | A = −.104624E − 10 | B = 0.152933E − 14 | C = 0.581088E − 18 |
| /// | D = −.550392E − 22 | E = 0.124756E − 26 | | |
| S34 | κ = 0.135728 | A = −.715391E − 08 | B = −.607874E − 12 | C = −.350272E − 16 |
| /// | D = 0.234373E − 21 | | | |
| S39 | κ = 2.262632 | A = −.112080E − 08 | B = 0.686428E − 14 | C = −.143140E − 17 |
| /// | D = 0.112838E − 21 | E = −.714641E − 27 | F = −.208714E − 30 | G = 0.705742E − 35 |

TABLE 4c

DESIGN PARAMETERS

| Parameter | Value |
|---|---|
| $f_1/f_3$ | 1.722 |
| $f_2/f_4$ | 1.023 |
| $f_5/L$ | 0.117 |
| $f_6/L$ | 0.350 |
| $f_4/L$ | −0.050 |
| $f_2/L$ | −0.052 |
| $f_2 n/L$ | −0.090 |
| $|R_5 n|/L$ | 0.234 |
| $|R_6 n|/L$ | 0.075 |
| $|R_1 n|/L$ | 0.211 |

As is clear from the aberration plots of FIGS. 9a–9g, the configuration of this Working Example is well-corrected for aberrations and is suitable for achieving the objectives of the present invention.

Working Example 5

Figure 10:
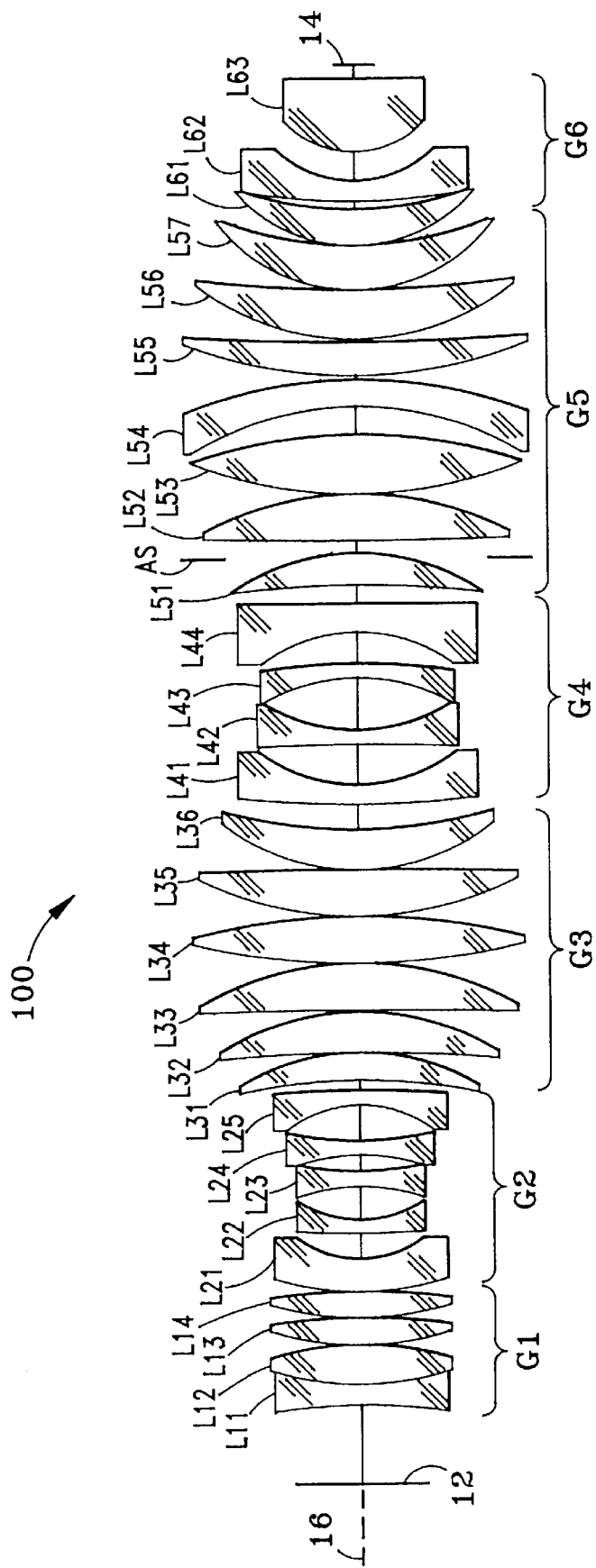
FIG. 10 is an optical diagram of Working Example 5 of the present invention.
Figure 11A:
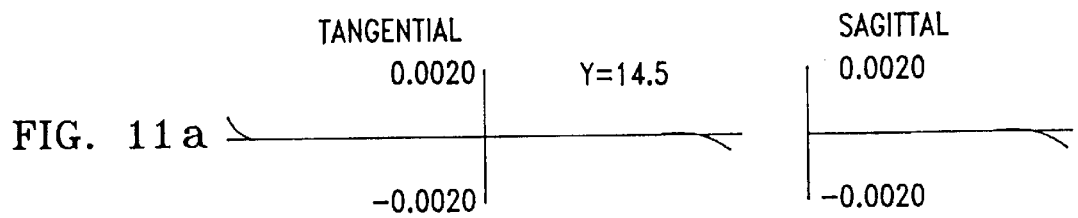
FIGS. 11a–11d are plots of lateral chromatic aberration (tangential and sagittal) for various field heights Y for Working Example 5 of the present invention.
Figure 11B:
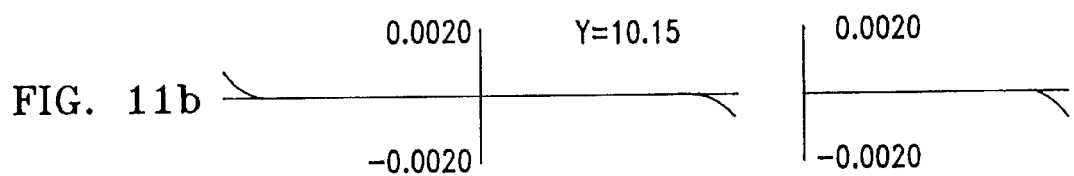
Figure 11C:
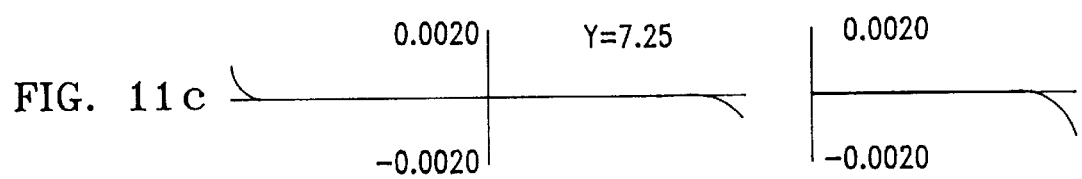
Figure 11D:
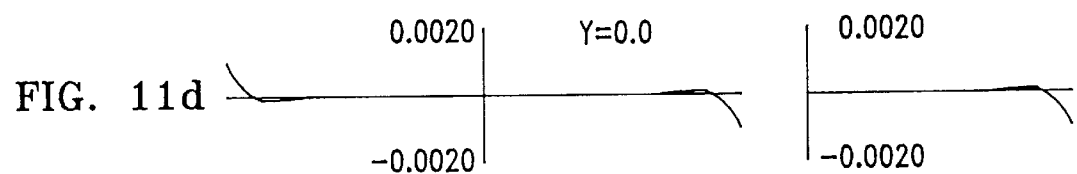
Figures 11E, 11F, 11G:
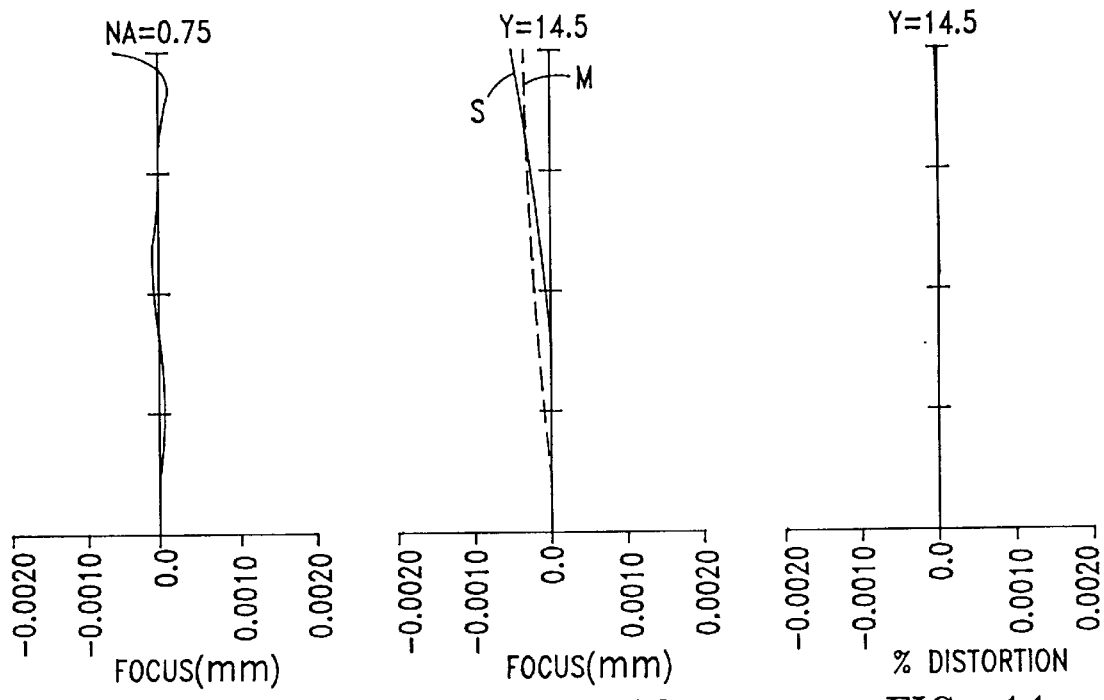
FIGS. 11e–11g are plots of spherical aberration, astigmatism, and distortion, respectively, for Working Example 5 of the present invention.

Projection lens 100 of FIG. 10 represents Working Example 5 and comprises the same number and type of lens elements as described above in connection with projection lens 20 of Working Example 1. In projection lens 100, the NA is 0.75, the magnification is 1/4, L is 1,200, the distance from object plane 12 to the most objectwise surface of lens element L11 is 60.0, the back focal length is 14.165006, and the maximum image height is 14.5.

TABLE 5a

| S | r | d | n | Group |
|---|---|---|---|---|
| 1 | −468.07699 | 18.000000 | 1.50839 | G1 |
| 2 | 250.12651 | 3.380259 | | |
| 3 | 300.99856 | 25.794382 | 1.50839 | |
| 4 | −362.12163 | 0.500000 | | |
| 5 | 400.86991 | 22.811466 | 1.50839 | |
| 6 | −450.23466 | 0.500000 | | |
| 7 | 268.97200 | 22.038806 | 1.50839 | |
| 8 | −1313.26659 | 0.500000 | | |
| 9 | 197.05591 | 29.172376 | 1.50839 | G2 |
| 10 | 124.31498 | 17.663331 | | |
| 11 | 407.81022 | 13.000000 | 1.50839 | |
| 12 | 161.89912 | 19.175412 | | |
| 13 | −566.17721 | 13.000000 | 1.50839 | |
| 14 | 197.37620 | 21.758555 | | |
| 15 | −263.68269 | 13.000000 | 1.50839 | |
| 16 | 429.32073 | 31.288348 | | |
| 17 | −131.12939 | 13.039244 | 1.50839 | |
| 18 | −917.99488 | 12.437120 | | |
| 19 | −413.92024 | 25.461495 | 1.50839 | G3 |
| 20 | −189.63472 | 1.144736 | | |
| 21 | −1419.86877 | 33.734236 | 1.50839 | |

TABLE 5a-continued

| S | r | d | n | Group |
|---|---|---|---|---|
| 22 | −253.10206 | 0.500000 | | |
| 23 | −17379.50305 | 39.118922 | 1.50839 | |
| 24 | −300.00000 | 0.500000 | | |
| 25 | 585.23935 | 39.230416 | 1.50839 | |
| 26 | −622.70279 | 0.500000 | | |
| 27 | 352.49897 | 38.565268 | 1.50839 | |
| 28 | −2181.80512 | 2.424434 | | |
| 29 | 203.28348 | 35.119714 | 1.50839 | |
| 30 | 683.31272 | 18.431385 | | |
| 31 | 1260.29479 | 14.211733 | 1.50839 | G4 |
| 32 | 150.00119 | 32.620701 | | |
| 33 | −2376.89219 | 13.177083 | 1.50839 | |
| 34 | 154.81553 | 45.778399 | | |
| 35 | −157.58025 | 13.177083 | 1.50839 | |
| 36 | −865.39866 | 27.070384 | | |
| 37 | −153.61567 | 20.819650 | 1.50839 | |
| 38 | −64924.10051 | 16.788651 | | |
| 39 | −712.18966 | 25.875000 | 1.50839 | G5 |
| 40 | −206.41949 | 2.097883 | | |
| 41 | INFINITY | 12.650000 | | |
| 42 | 3973.02616 | 41.592649 | 1.50839 | |
| 43 | −299.72179 | 0.500000 | | |
| 44 | 447.61811 | 49.373870 | 1.50839 | |
| 45 | −450.53837 | 19.003149 | | |
| 46 | −279.78056 | 21.961806 | 1.50839 | |
| 47 | −404.06473 | 6.780768 | | |
| 48 | 379.72454 | 33.386064 | 1.50839 | |
| 49 | 2500.00000 | 4.142460 | | |
| 50 | 283.16075 | 35.076227 | 1.50839 | |
| 51 | 1489.01547 | 0.500000 | | |
| 52 | 164.88650 | 35.591626 | 1.50839 | |
| 53 | 339.88457 | 0.500000 | | |
| 54 | 144.51257 | 30.264029 | 1.50839 | G6 |
| 55 | 294.74328 | 9.221153 | | |
| 56 | 550.00000 | 13.000000 | 1.50839 | |
| 57 | 92.59167 | 25.876306 | | |
| 58 | 90.49578 | 63.008413 | 1.50839 | |
| 59 | 487.58159 | | | |

TABLE 5b

ASPHERIC SURFACE DATA

| | | | |
|---|---|---|---|
| S3 κ = 1.188206 | A = 0.616724E − 08 | B = −.261943E − 12 | C = 0.117836E − 16 |
| /// D = −.276255E − 20 | E = 0.421652E − 24 | F = −.526812E − 28 | G = 0.415909E − 32 |
| S16 κ = −1.301521 | A = −.465204E − 09 | B = −.629003E − 12 | C = −.166260E − 16 |
| /// D = 0.121986E − 20 | | | |
| S30 κ = −0.350261 | A = −.149448E − 09 | B = 0.999815E − 14 | C = 0.678281E − 18 |
| /// D = −.619666E − 22 | E = 0.152611E − 26 | | |
| S34 κ = 0.145290 | A = −.672935E − 08 | B = −.638504E − 12 | C = −.369923E − 16 |
| /// D = 0.382079E − 21 | | | |
| S39 κ = 2.321086 | A = −.116397E − 08 | B = 0.107347E − 13 | C = −.124164E − 17 |
| /// D = 0.119458E − 21 | E = −.185166E − 26 | F = −.163469E − 30 | G = 0.519016E − 35 |
| S56 κ = −0.669816 | A = −.531655E − 09 | B = 0.331972E − 13 | C = −.471706E − 17 |
| /// D = 0.347702E − 21 | E = −.101574E − 25 | | |

TABLE 5c

DESIGN PARAMETERS

| Parameter | Value |
|---|---|
| $f_1/f_3$ | 1.734 |
| $f_2/f_4$ | 1.036 |
| $f_5/L$ | 0.118 |
| $f_6/L$ | 0.357 |
| $f_4/L$ | −0.050 |
| $f_2/L$ | −0.052 |
| $f_2 n/L$ | −0.091 |
| $|R_5 n|/L$ | 0.233 |
| $|R_6 n|/L$ | 0.077 |
| $|R_1 n|/L$ | 0.208 |

As is clear from the aberration plots of FIGS. 11a–11f, the configuration of this Working Example is well-corrected for aberrations and is suitable for achieving the objectives of the present invention.

Working Example 6

Figure 12:
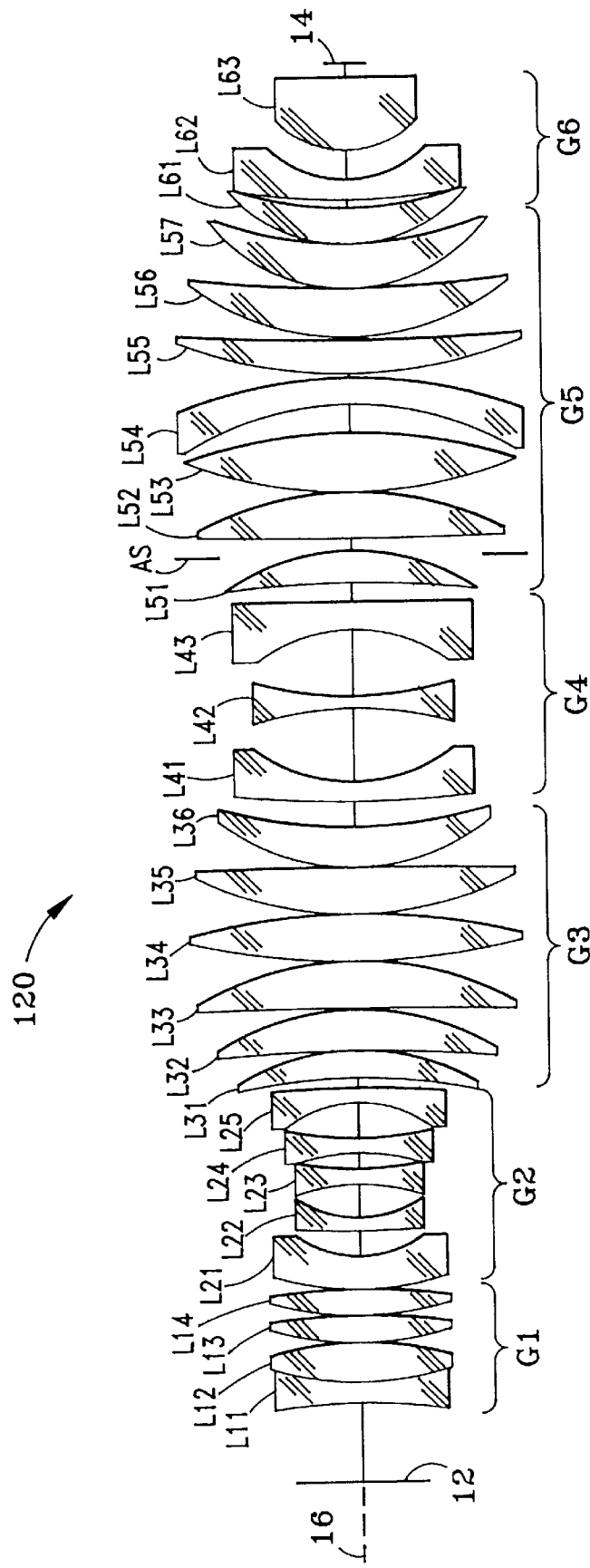
FIG. 12 is an optical diagram of Working Example 6 of the present invention.
Figure 13F:
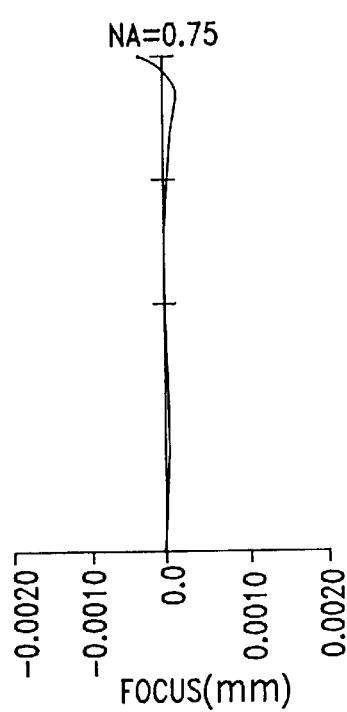
FIGS. 13f–13h are plots of spherical aberration, astigmatism, and distortion, respectively, for Working Example 6 of the present invention.
Figure 13G:
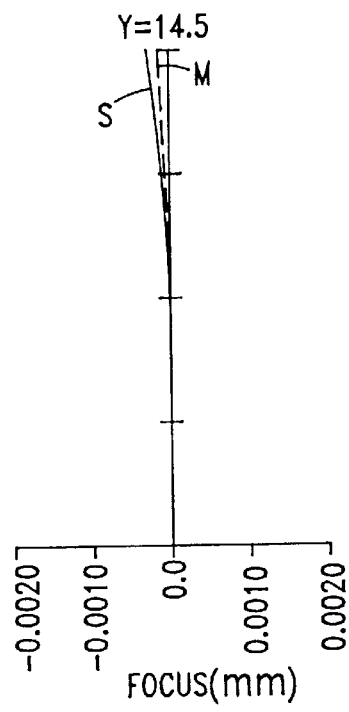
Figure 13H:
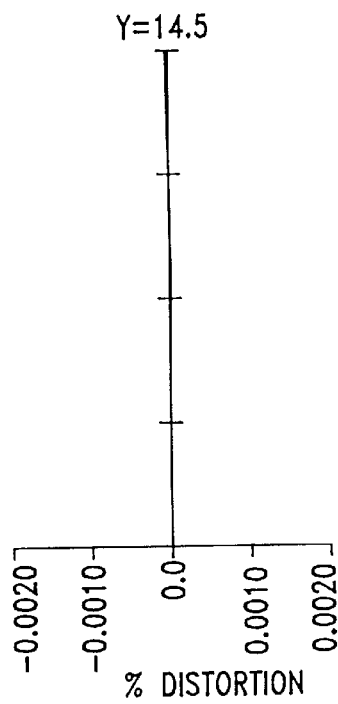

Projection lens 120 of FIG. 12 represents Working Example 6 and comprises the same number and type of lens elements as described above in connection with projection lens 20 of Working Example 1, with the exception of lens group G4, which now comprises a negative meniscus lens element L41 having an objective convex surface, a biconvex lens element L42, and a negative meniscus lens element L43 having an objectwise concave surface.

In projection lens 120 of FIG. 12, the NA is 0.75, the magnification is 1/4, L is 1,200, the distance from object plane 12 to the most objectwise surface of lens element L11 is 60.0, the back focal length is 12.647270, and the maximum image height is 14.5.

TABLE 6a

| S | r | d | n | Group |
|---|---|---|---|---|
| 1 | −420.30684 | 18.000000 | 1.50839 | G1 |
| 2 | 304.38947 | 4.844904 | | |
| 3 | 409.93724 | 25.000000 | 1.50839 | |
| 4 | −345.79137 | 0.500000 | | |
| 5 | 344.48673 | 24.000000 | 1.50839 | |
| 6 | −492.43913 | 0.500000 | | |
| 7 | 268.47429 | 22.000000 | 1.50839 | |
| 8 | −561.19048 | 0.500000 | | |
| 9 | 228.49034 | 29.172376 | 1.50839 | G2 |
| 10 | 124.66129 | 21.915174 | | |
| 11 | 2782.29168 | 13.000000 | 1.50839 | |
| 12 | 168.55342 | 21.234352 | | |

TABLE 6a-continued

| S | r | d | n | Group |
|---|---|---|---|---|
| 13 | −322.47044 | 13.000000 | 1.50839 | |
| 14 | 323.01386 | 22.100306 | | |
| 15 | −182.39320 | 13.000000 | 1.50839 | |
| 16 | 1378.53916 | 26.743800 | | |
| 17 | −144.71537 | 13.000000 | 1.50839 | |
| 18 | −834.60001 | 13.279960 | | |
| 19 | −543.83120 | 27.401869 | 1.50839 | G3 |
| 20 | −205.14464 | 0.500000 | | |
| 21 | −800.01554 | 34.638631 | 1.50839 | |
| 22 | −224.70509 | 0.500000 | | |
| 23 | −25065.93947 | 39.466543 | 1.50839 | |
| 24 | −301.52652 | 0.500000 | | |
| 25 | 345.26248 | 39.230416 | 1.50839 | |
| 26 | −2517.70773 | 0.500000 | | |
| 27 | 314.76800 | 38.166279 | 1.50839 | |
| 28 | −17038.75030 | 0.500000 | | |
| 29 | 200.00000 | 34.537615 | 1.50839 | |
| 30 | 557.24026 | 17.007263 | | |
| 31 | 2180.25083 | 13.025262 | 1.50839 | G4 |
| 32 | 123.59069 | 61.421633 | | |
| 33 | −205.98730 | 13.177083 | 1.50839 | |
| 34 | 202.28713 | 68.572390 | | |
| 35 | −159.41306 | 24.495231 | 1.50839 | |
| 36 | −3005.44394 | 14.667092 | | |
| 37 | −697.48612 | 25.875000 | 1.50839 | G5 |
| 38 | −225.08993 | 0.500000 | | |
| 39 | 0.00000 | 12.650000 | | |
| 40 | 1639.18095 | 38.602593 | 1.50839 | |
| 41 | −334.50135 | 0.500000 | | |
| 42 | 578.12145 | 49.373870 | 1.50839 | |
| 43 | −367.69622 | 15.341733 | | |
| 44 | −266.45720 | 21.961806 | 1.50839 | |
| 45 | −400.63356 | 0.733794 | | |
| 46 | 387.43403 | 35.000000 | 1.50839 | |
| 47 | 2408.33297 | 0.500000 | | |
| 48 | 250.43557 | 35.000000 | 1.50839 | |
| 49 | 806.42950 | 0.500000 | | |
| 50 | 175.00000 | 35.921145 | 1.50839 | |
| 51 | 377.77144 | 1.715742 | | |
| 52 | 146.02491 | 30.182778 | 1.50839 | G6 |
| 53 | 302.71543 | 10.356697 | | |
| 54 | 550.00000 | 13.000000 | 1.50839 | |
| 55 | 88.62882 | 21.641507 | | |
| 56 | 89.87518 | 67.897884 | 1.50839 | |
| 57 | 610.57068 | | | |

TABLE 6b

ASPHERIC SURFACE DATA

| | | | | | | | |
|---|---|---|---|---|---|---|---|
| S34 | κ = 0.022695 | | A = −.127712E − 07 | B = −.986372E − 12 | C = 0.160059E − 16 | | |
| /// | D = 0.143506E − 20 | | | | | | |
| S37 | κ = −6.954337 | | A = 0.176680E − 09 | B = 0.544891E − 13 | C = 0.110204E − 17 | | |
| /// | D = 0.158373E − 21 | | E = −.249194E − 26 | F = 0.166870E − 30 | G = −.294689E − 36 | | |

TABLE 6c

DESIGN PARAMETERS

| Parameter | Value |
|---|---|
| $f_1/f_3$ | 1.584 |
| $f_2/f_4$ | 0.930 |
| $f_5/L$ | 0.117 |
| $f_6/L$ | 0.361 |
| $f_4/L$ | −0.052 |
| $f_2/L$ | −0.048 |
| $f_2 n/L$ | −0.082 |
| $|R_5 n|/L$ | 0.222 |
| $|R_6 n|/L$ | 0.074 |
| $|R_1 n|/L$ | 0.254 |

As is clear from the aberration plots of FIGS. 13a–13h, the configuration of this Working Example is well-corrected for aberrations and is suitable for achieving the objectives of the present invention.

Working Example 7

Figure 14:
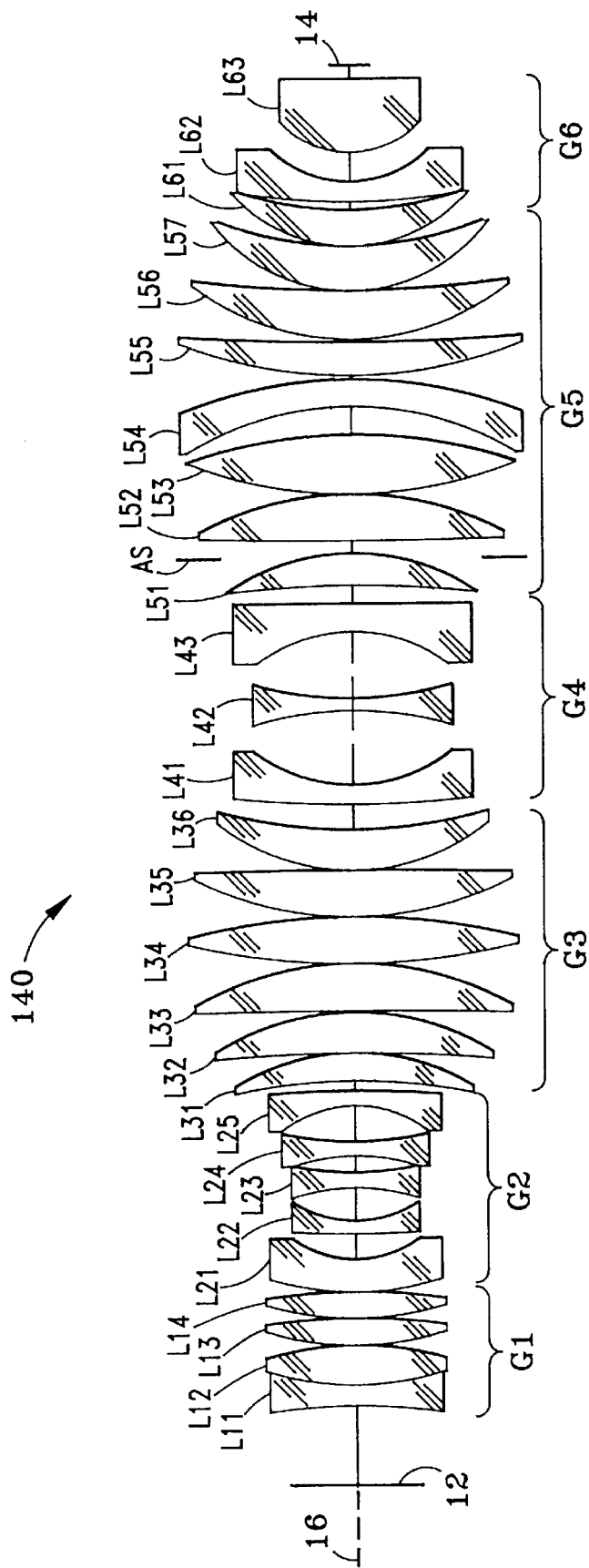
FIG. 14 is an optical diagram of Working Example 7 of the present invention.
Figure 15F:
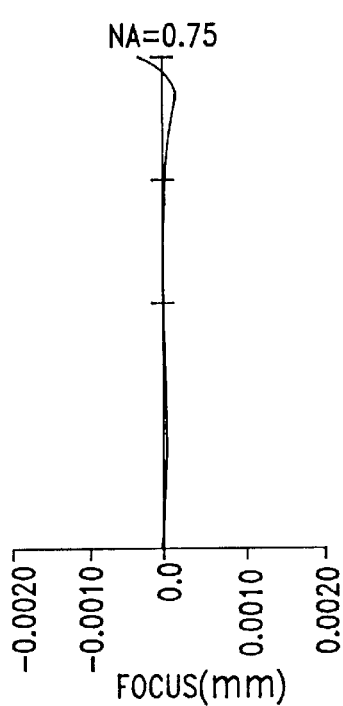
FIGS. 15f–15h are plots of spherical aberration, astigmatism, and distortion, respectively, for Working Example 7 of the present invention.
Figure 15G:
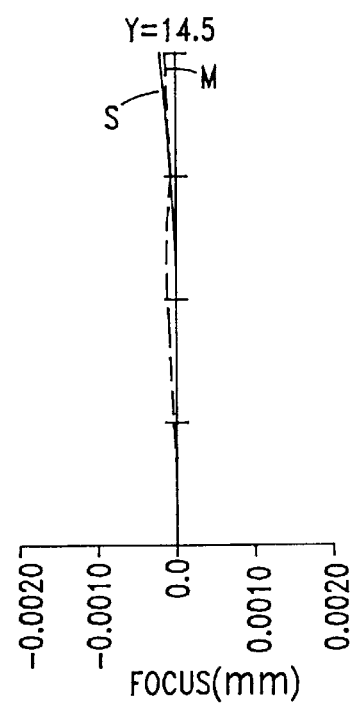
Figure 15H:
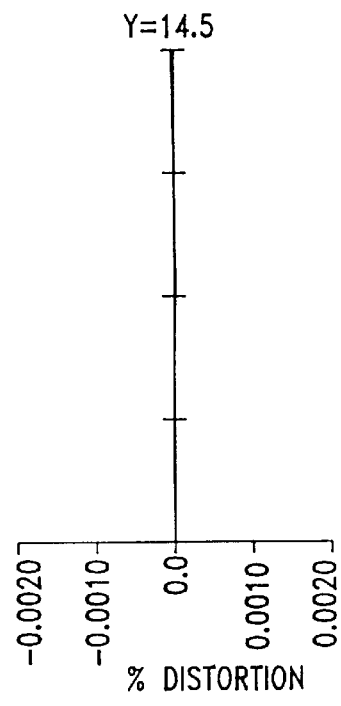

Projection lens 140 of FIG. 14 represents Working Example 7 and comprises the same number and type of lens elements as described above in connection with projection lens 120 of Working Example 6. In projection lens 140, the NA is 0.75, the magnification is 1/4, L is 1,200, the distance from object plane 12 to the most objectwise surface of lens element L11 is 60.0, the back focal length is 12.598236, and the maximum image height is 14.5.

TABLE 7a

| S | r | d | n | Group |
|---|---|---|---|---|
| 1 | −394.79113 | 18.000000 | 1.50839 | G1 |
| 2 | 316.86963 | 3.432096 | | |
| 3 | 385.17199 | 23.971420 | 1.50839 | |
| 4 | −332.08412 | 0.500000 | | |
| 5 | 385.76588 | 23.018363 | 1.50839 | |
| 6 | −462.41329 | 0.500000 | | |
| 7 | 261.83315 | 24.873425 | 1.50839 | |
| 8 | −662.07882 | 0.500000 | | |
| 9 | 217.44326 | 26.470552 | 1.50839 | G2 |
| 10 | 130.19538 | 18.160493 | | |
| 11 | 577.89686 | 13.000000 | 1.50839 | |
| 12 | 151.58758 | 21.170084 | | |
| 13 | −399.45469 | 13.000000 | 1.50839 | |
| 14 | 213.97370 | 23.645709 | | |
| 15 | −198.33421 | 13.000000 | 1.50839 | |
| 16 | 596.96132 | 28.357042 | | |
| 17 | −145.18221 | 13.000000 | 1.50839 | |
| 18 | −662.45369 | 12.854593 | | |
| 19 | −556.70481 | 27.433961 | 1.50839 | G3 |
| 20 | −204.71209 | 0.500000 | | |

TABLE 7a-continued

| S | r | d | n | Group |
|---|---|---|---|---|
| 21 | −1365.15240 | 34.520424 | 1.50839 | |
| 22 | −251.45530 | 0.500000 | | |
| 23 | 16097.83839 | 39.574978 | 1.50839 | |
| 24 | −310.66803 | 0.500000 | | |
| 25 | 443.70292 | 39.230416 | 1.50839 | |
| 26 | −946.94062 | 0.500000 | | |
| 27 | 322.23157 | 38.264073 | 1.50839 | |
| 28 | −5486.68682 | 0.500000 | | |
| 29 | 217.22460 | 34.776707 | 1.50839 | |
| 30 | 799.91884 | 18.173304 | | |
| 31 | 12387.52204 | 13.000000 | 1.50839 | G4 |
| 32 | 125.69696 | 61.545246 | | |
| 33 | −192.59778 | 13.177083 | 1.50839 | |
| 34 | 191.97054 | 68.673889 | | |
| 35 | −173.96143 | 23.724806 | 1.50839 | |
| 36 | −1430.00455 | 12.091296 | | |
| 37 | −518.50264 | 25.875000 | 1.50839 | G5 |
| 38 | −213.41585 | 0.500095 | | |
| 39 | 0.00000 | 12.650000 | | |
| 40 | 1394.83283 | 38.762785 | 1.50839 | |
| 41 | −348.55455 | 0.514756 | | |
| 42 | 589.68098 | 49.373870 | 1.50839 | |
| 43 | −363.24607 | 18.952009 | | |
| 44 | −261.91151 | 21.961806 | 1.50839 | |
| 45 | −400.00000 | 0.500000 | | |
| 46 | 380.51168 | 35.000000 | 1.50839 | |
| 47 | 2500.00000 | 0.500000 | | |
| 48 | 255.67104 | 35.000000 | 1.50839 | |
| 49 | 850.67403 | 0.500000 | | |
| 50 | 175.00000 | 33.349227 | 1.50839 | |
| 51 | 354.54268 | 0.500000 | | |
| 52 | 147.57414 | 30.804902 | 1.50839 | G6 |
| 53 | 309.21683 | 8.726274 | | |
| 54 | 550.00000 | 13.000000 | 1.50839 | |
| 55 | 92.71485 | 21.778859 | | |
| 56 | 94.51983 | 75.002069 | 1.50839 | |
| 57 | 660.56474 | 12.598236 | | |

TABLE 7b

ASPHERIC SURFACE DATA

| | | | | | | | |
|---|---|---|---|---|---|---|---|
| S16 | κ = −0.080829 | | A = 0.257830E − 08 | B = −.623179E − 12 | | C = −.103089E − 17 | |
| /// | D = 0.254598E − 21 | | | | | | |
| S34 | κ = −0.091698 | | A = −.162846E − 07 | B = −.980291E − 12 | | C = 0.203271E−16 | |
| /// | D = 0.178089E − 20 | | | | | | |
| S37 | κ = −6.872295 | | A = 0.413563E − 09 | B = 0.166773E − 12 | | C = 0.144211E − 17 | |
| /// | D = 0.194986E − 21 | | E = −.432989E − 27 | F = 0.197137E − 30 | | G = −.735338E − 36 | |

TABLE 7c

DESIGN PARAMETERS

| Parameter | Value |
|---|---|
| $f_1/f_3$ | 1.602 |
| $f_2/f_4$ | 0.933 |
| $f_5/L$ | 0.119 |
| $f_6/L$ | 0.361 |
| $f_4/L$ | −0.052 |
| $f_2/L$ | −0.049 |
| $f_2n/L$ | −0.079 |
| $|R_5n|/L$ | 0.218 |
| $|R_6n|/L$ | 0.077 |
| $|R_1n|/L$ | 0.264 |

As is clear from the aberration plots of FIGS. 15a–15h, the configuration of this Working Example is well-corrected for aberrations and is suitable for achieving the objectives of the present invention.

Working Example 8

Figure 16:
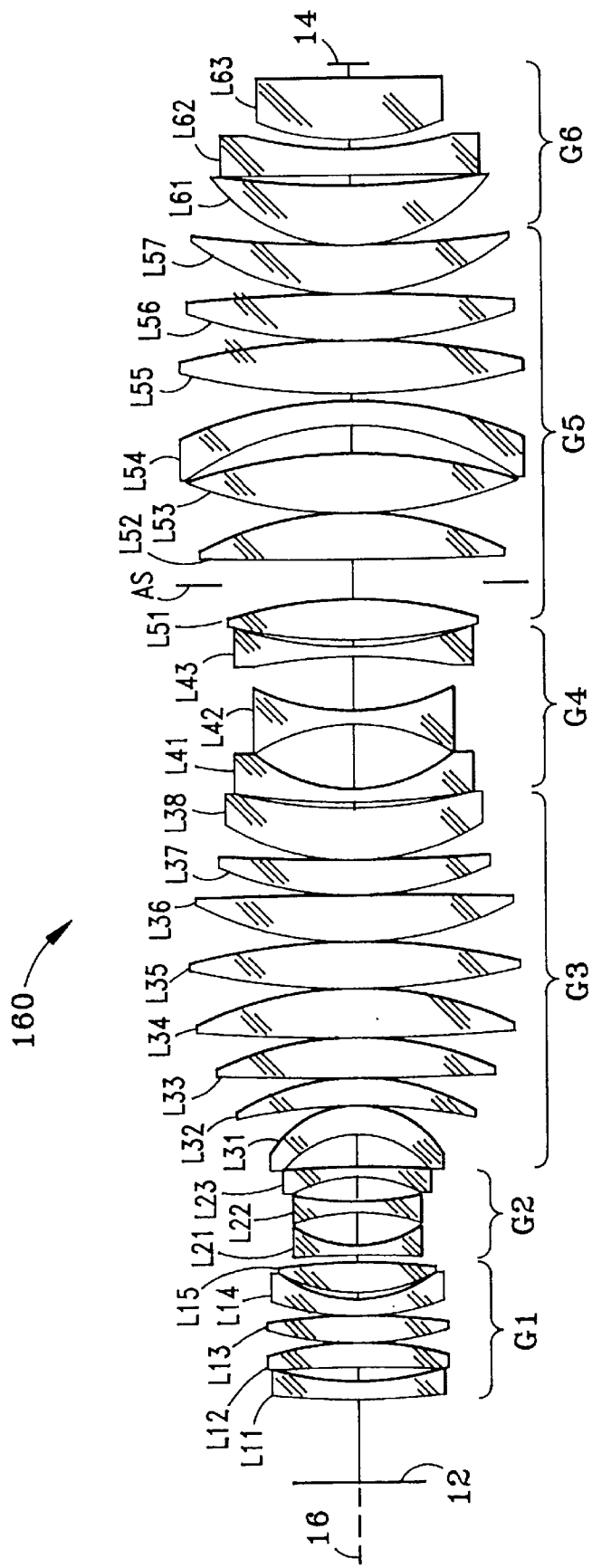
FIG. 16 is an optical diagram of Working Example 8 of the present invention.
Figure 17F:
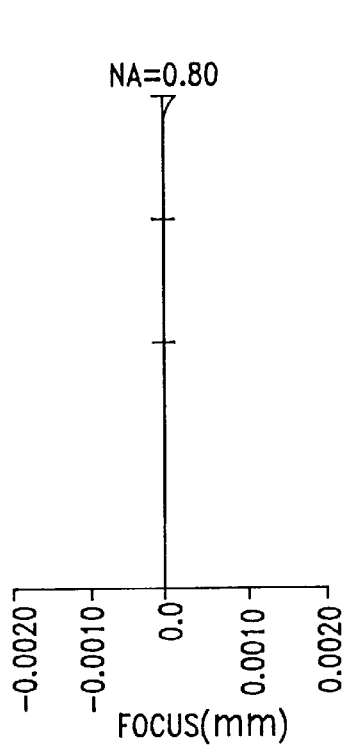
FIGS. 17f–17h are plots of spherical aberration, astigmatism, and distortion, respectively, for Working Example 8 of the present invention.
Figure 17G:
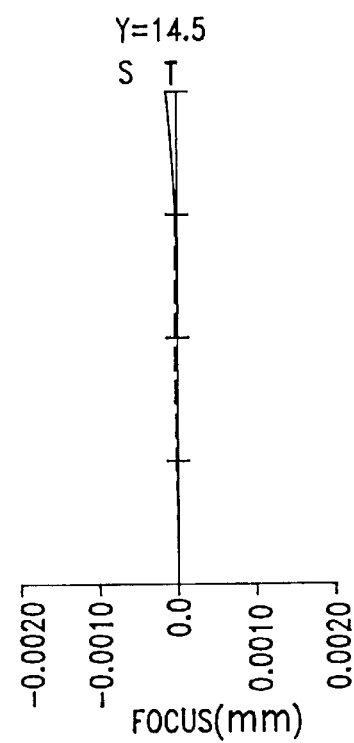
Figure 17H:
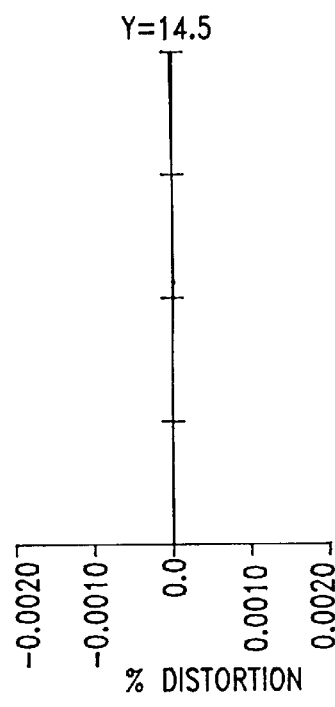

Projection lens 160 of FIG. 16 represents Working Example 8 and comprises, from object plane 12 to image plane 14, first lens group G1 comprising a negative meniscus lens element L11 having an objectwise convex surface, a biconvex lens element L12, a biconvex lens element L13, a negative meniscus lens element L14 having an objectwise convex surface, and a biconvex lens element L15. Next is lens group G2 comprising a biconcave lens element L21, a biconcave lens element L22, and a negative meniscus lens element L23 having an objectwise concave surface. Next is lens group G3 comprising a positive meniscus lens element L31 having an objectwise concave surface, a positive meniscus lens element L32 having an objectwise concave surface, a biconvex lens element L33, a biconvex lens element L34, a biconvex lens element L35, a positive meniscus lens element L36 having an objectwise convex surface, a positive meniscus lens element L37 having an objectwise convex surface, a positive meniscus lens element L38 having an objectwise convex surface.

Next is lens group G4 comprising a negative meniscus lens element L41 having an objectwise convex surface, a biconvex lens element L42, and a biconvex lens element L43. Next is lens group G5 comprising a biconvex lens element L51, a positive meniscus lens element L52 having an objectwise concave surface, a biconvex lens element L53, a negative meniscus lens element L54 having an objectwise concave surface, a biconvex lens element L55, a biconvex lens element L56, and a positive meniscus lens element L57 having an objectwise convex surface. Next is lens group G6 comprising a positive meniscus lens element L61 having an objectwise convex surface, biconcave lens element L62, and a positive meniscus lens element L63 having an objectwise convex surface. Aperture Stop AS is disposed between lens element L51 and lens element L52 in lens group G5.

In projection lens 160 of FIG. 16, the NA is 0.80, the magnification is 1/4, L is 1,500, the on-axis distance from object plane 12 to the most objectwise lens surface of lens element L11 is 92.0, the back focal length is 27.74 and the maximum image height is 14.5.

TABLE 8a

| S | r | d | n | Group |
|---|---|---|---|---|
| 1 | 718.85125 | 20.000000 | 1.50839 | G1 |
| 2 | 419.76270 | 10.000000 | | |
| 3 | 37714.38709 | 22.138562 | 1.50839 | |
| 4 | −310.65200 | 0.100000 | | |
| 5 | 350.56680 | 25.585801 | 1.50839 | |
| 6 | −839.94573 | 0.100000 | | |
| 7 | 187.27742 | 15.000000 | 1.50839 | |
| 8 | 129.63561 | 10.193899 | | |
| 9 | 185.52772 | 37.726567 | 1.50839 | |
| 10 | −359.67498 | 10.000000 | | |
| 11 | −380.92840 | 10.032688 | 1.50839 | G2 |
| 12 | 117.09613 | 32.010931 | | |
| 13 | −287.93550 | 10.000000 | 1.50839 | |
| 14 | 194.76378 | 32.284079 | | |
| 15 | −158.72745 | 10.003793 | 1.50839 | |
| 16 | −1178.65823 | 36.540933 | | |
| 17 | −123.26109 | 29.351802 | 1.50839 | G3 |
| 18 | −133.12159 | 1.000000 | | |
| 19 | −502.15858 | 25.000000 | 1.50839 | |
| 20 | −302.23345 | 0.100000 | | |
| 21 | 7363.85681 | 43.843308 | 1.50839 | |
| 22 | −425.68991 | 0.100000 | | |
| 23 | 1729.87203 | 45.555947 | 1.50839 | |
| 24 | −600.00000 | 0.200000 | | |
| 25 | 865.80263 | 40.012505 | 1.50839 | |
| 26 | −1554.86289 | 2.156975 | | |
| 27 | 509.3991 | 43.360383 | 1.50839 | |
| 28 | 99999.00000 | 3.749801 | | |
| 29 | 378.69505 | 44.864067 | 1.50839 | |
| 30 | 3000.00000 | 0.000001 | | |
| 31 | 308.96606 | 53.780418 | 1.50839 | |
| 32 | 506.87544 | 5.000000 | | |
| 33 | 802.31214 | 13.801460 | 1.50839 | G4 |
| 34 | 146.21750 | 72.358454 | | |
| 35 | −229.01266 | 15.000000 | 1.50839 | |
| 36 | 241.96265 | 73.389500 | | |
| 37 | −309.06925 | 10.000000 | 1.50839 | |
| 38 | 551.94211 | 6.102207 | | |
| 39 | 752.97283 | 45.581180 | 1.50839 | G5 |
| 40 | −416.05599 | 15.000000 | | |
| 41 | INFINITY | 15.000000 | | |
| 42 | −4226.71251 | 38.697035 | 1.50839 | |
| 43 | −420.41230 | 0.100000 | | |
| 44 | 546.12722 | 57.018027 | 1.50839 | |
| 45 | −752.79962 | 36.208246 | | |
| 46 | −292.99042 | 25.000000 | 1.50839 | |
| 47 | −526.52023 | 4.113016 | | |
| 48 | 1204.71132 | 54.118430 | 1.50839 | |
| 49 | −639.03474 | 0.100000 | | |
| 50 | 556.47285 | 50.363514 | 1.50839 | |
| 51 | −1972.93848 | 0.100000 | | |
| 52 | 244.15849 | 53.094475 | 1.50839 | |
| 53 | 700.00000 | 0.100000 | | |
| 54 | 192.23824 | 49.559672 | 1.50839 | G6 |
| 55 | 568.53429 | 14.794053 | | |
| 56 | 99999.00000 | 30.754870 | 1.50839 | |

TABLE 8a-continued

| S | r | d | n | Group |
|---|---|---|---|---|
| 57 | 307.32702 | 11.653900 | | |
| 58 | 186.45334 | 68.559500 | 1.50839 | |
| 59 | 1043.98610 | | | |

TABLE 8b

ASPHERIC SURFACE DATA

| S14 | $\kappa$ = 0.000000 | A = −.825926E − 07 | B = −.220422E − 11 | C = −.447231E − 16 |
|---|---|---|---|---|
| /// | D = −.146561E − 19 | E = 0.184702E − 23 | F = −.287752E − 27 | |
| S35 | $\kappa$ = 0.000000 | A = −.502044E − 08 | B = −.264019E − 12 | C = −.964365E − 17 |
| /// | D = −.133885E − 23 | E = −.303209E − 25 | F = 0.972304E − 30 | |
| S40 | $\kappa$ = 0.000000 | A = 0.295553E − 08 | B = 0.182366E − 12 | C = 0.650083E − 17 |
| /// | D = 0.376932E − 21 | E = −.240887E − 26 | F = 0.849451E − 30 | |

TABLE 8c

DESIGN PARAMETERS

| Parameter | Value |
|---|---|
| $f_1/f_3$ | 1.134 |
| $f_2/f_4$ | 0.836 |
| $f_5/L$ | 0.133 |
| $f_6/L$ | 0.280 |
| $f_4/L$ | −0.052 |
| $f_2/L$ | −0.043 |
| $f_2n/L$ | −0.043 |
| $|R_5n|/L$ | 0.195 |
| $|R_1n|/L$ | 0.280 |

As is clear from the aberration plots of FIGS. 17a–17h, the configuration of this Working Example is well-corrected for aberrations and is suitable for achieving the objectives of the present invention.

Working Example 9

Figure 18:
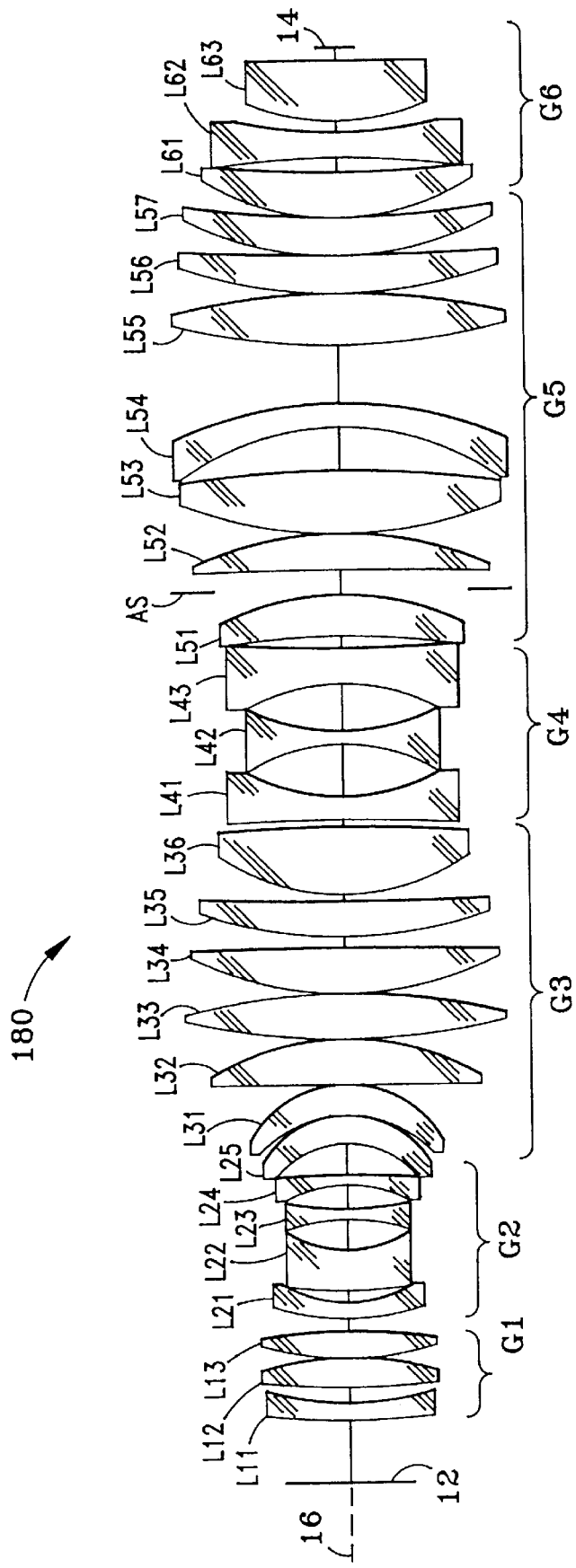
FIG. 18 is an optical diagram of Working Example 9 of the present invention.
Figure 19F:
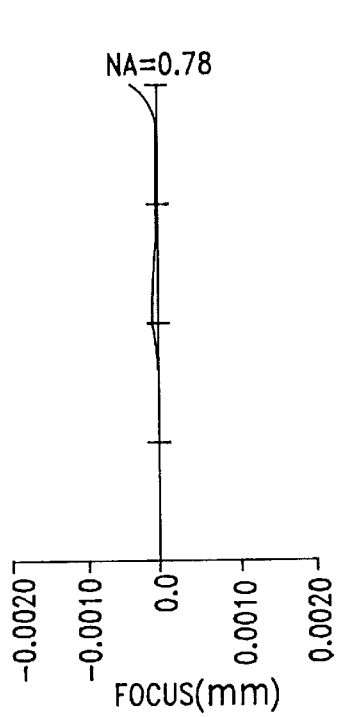
FIGS. 19f–19h are plots of spherical aberration, astigmatism, and distortion, respectively, for Working Example 9 of the present invention.
Figure 19G:
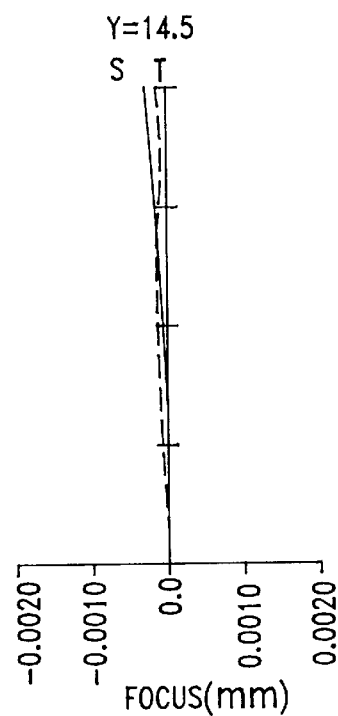
Figure 19H:
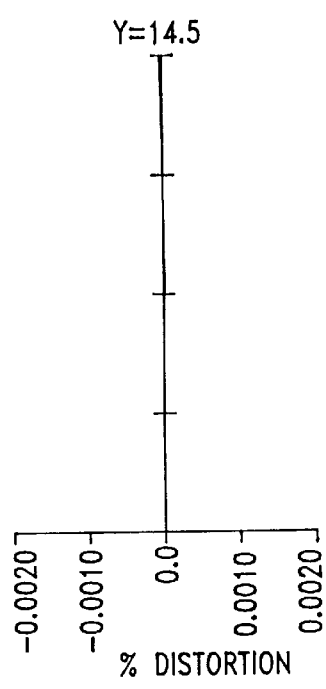

Projection lens 180 of FIG. 18 represents Working Example 9 and comprises, from object plane 12 to image plane 14, first lens group G1 comprising a negative meniscus lens element L11 having an objectwise convex surface, a biconvex lens element L12, and a biconvex lens element L13. Next is lens group G2 comprising a negative meniscus lens element L21 having an objectwise convex surface, a negative meniscus lens element L22 having an objectwise convex surface, a biconvex lens element L23, a negative meniscus lens element L24 having an objectwise concave surface, and a negative meniscus lens element L25 having an objectwise concave surface. Next is lens group G3 comprising a positive meniscus lens element L31 having an objectwise concave surface, a positive meniscus lens element L32 having an objectwise concave surface, a biconvex lens element L33, a biconvex lens element L34, a positive meniscus lens element L35 having an objectwise convex surface, and a biconvex lens element L36. Next is lens group G4 comprising a plano-concave lens element L41 having an objectwise planer surface, a biconcave lens element L42, and a biconcave lens element L43. Next is lens group G5 comprising a positive meniscus lens element L51 having an objectwise concave surface, a negative meniscus lens element L52 having an objectwise concave surface, a biconvex lens element L53, a negative meniscus lens element L54 having an objectwise concave surface, a biconvex lens element L55, a positive meniscus lens element L56 having an objectwise convex surface, and a positive meniscus lens element L57 having an objectwise convex surface. Next is lens group G6 comprising a positive meniscus lens element L61 having an objectwise convex surface, a biconcave lens element L62, and a positive meniscus lens element L63, having an objectwise convex surface. Aperture stop AS is disposed between lens elements L51 and L52 in lens group G5.

In projection lens 180 of FIG. 18, the NA is 0.78, the magnification is 1/4, L is 1,500, the on-axis distance from object plane 12 to the most objectwise surface of Lens L11 is 92.0, the back focal length is 19.095569, and the maximum image height is 14.5.

TABLE 9a

| S | r | d | n | Group |
|---|---|---|---|---|
| 1 | 500.00000 | 20.000000 | 1.50839 | G1 |
| 2 | 430.00000 | 10.000000 | | |
| 3 | 931.80900 | 23.718892 | 1.50839 | |
| 4 | −362.97952 | 0.100000 | | |
| 5 | 332.06640 | 25.995825 | 1.50839 | |
| 6 | −732.52220 | 13.842797 | | |
| 7 | 206.89029 | 15.000000 | 1.50839 | G2 |
| 8 | 149.50025 | 15.414059 | | |
| 9 | 511.22833 | 39.506945 | 1.50839 | |
| 10 | 149.73196 | 30.626199 | | |
| 11 | −187.69536 | 10.000000 | 1.50839 | |
| 12 | 215.87573 | 24.165184 | | |
| 13 | −280.84891 | 15.000000 | 1.50839 | |
| 14 | −1495.99441 | 32.241853 | | |
| 15 | −132.56240 | 23.125310 | 1.50839 | |
| 16 | −193.90245 | 0.536304 | | |
| 17 | −246.39953 | 33.677028 | 1.50839 | G3 |
| 18 | −170.42850 | 0.449647 | | |
| 19 | −18093.58705 | 52.266017 | 1.50839 | |
| 20 | −307.72240 | 0.100000 | | |
| 21 | 1028.99344 | 52.040848 | 1.50839 | |
| 22 | −564.72447 | 0.200000 | | |
| 23 | 463.92013 | 47.252819 | 1.50839 | |
| 24 | −5413.06676 | 10.736526 | | |
| 25 | 565.81685 | 37.800000 | 1.50839 | |
| 26 | 2892.95526 | 6.361992 | | |
| 27 | 298.99587 | 75.000000 | 1.50839 | |
| 28 | −3000.00000 | 5.000000 | | |
| 29 | INFINITY | 24.356049 | 1.50839 | G4 |
| 30 | 164.11897 | 50.949748 | | |
| 31 | −357.71936 | 10.000000 | 1.50839 | |
| 32 | 195.03967 | 58.555088 | | |
| 33 | −182.56313 | 41.236081 | 1.50839 | |
| 34 | 5843.26761 | 11.029510 | | |
| 35 | −883.21453 | 48.737208 | 1.50839 | G5 |
| 36 | −295.17959 | 5.000000 | | |
| 37 | INFINITY | 25.000000 | | |
| 38 | −5542.32804 | 44.564616 | 1.50839 | |
| 39 | −367.50993 | 0.100000 | | |
| 40 | 443.75606 | 75.000000 | 1.50839 | |
| 41 | −1085.66088 | 30.000000 | | |
| 42 | −400.26612 | 25.000000 | 1.50839 | |
| 43 | −525.63201 | 4.113016 | | |
| 44 | 658.76285 | 48.097310 | 1.50839 | |
| 45 | −5983.44019 | 0.100000 | | |

TABLE 9a-continued

| S | r | d | n | Group |
|---|---|---|---|---|
| 46 | 345.33254 | 43.329194 | 1.50839 | |
| 47 | 1409.15145 | 0.100000 | | |
| 48 | 262.42521 | 46.228330 | 1.50839 | |
| 49 | 750.00000 | 0.100000 | | |
| 50 | 198.86479 | 48.865418 | 1.50839 | G6 |
| 51 | 623.68097 | 17.416378 | | |
| 52 | −942.86893 | 30.754870 | 1.50839 | |
| 53 | 625.62224 | 11.553900 | | |
| 54 | 196.70372 | 68.559500 | 1.50839 | |
| 55 | 860.93535 | | | |

TABLE 9b

ASPHERIC SURFACE DATA

| S12 | κ = 0.000000 | A = −.415050E − 07 | B = −.756052E − 12 | C = 0.260560E − 16 |
| /// | D = 0.209992E − 20 | E = −.237405E − 24 | F = 0.483178E − 29 | |
| S29 | κ = 0.000000 | A = 0.102099E − 09 | B = −.188042E − 13 | C = 0.267234E − 17 |
| /// | D = −.475339E − 22 | E = −.256151E − 27 | F = 0.160661E − 31 | |
| S36 | κ = 0.000000 | A = 0.403820E − 09 | B = 0.262131E − 13 | C = 0.256593E − 18 |
| /// | D = −.436766E − 22 | E = −.138744E − 26 | F = 0.520594E − 31 | |
| S52 | κ = 0.000000 | A = 0.118684E − 07 | B = −.447939E − 12 | C = 0.245274E − 16 |
| /// | D = −.116536E − 20 | E = 0.385264E − 25 | F = −.631033E − 30 | |

TABLE 9c

DESIGN PARAMETERS

| Parameter | Value |
|---|---|
| $f_1/f_3$ | 1.658 |
| $f_2/f_4$ | 1.033 |
| $f_5/L$ | 0.128 |
| $f_6/L$ | 0.280 |
| $f_4/L$ | −0.053 |
| $f_2/L$ | −0.055 |
| $f_2n/L$ | −0.070 |
| $|R_5n|/L$ | 0.267 |
| $|R_1n|/L$ | 0.287 |

As is clear from the aberration plots of FIGS. 19a–19h, the configuration of this Working Example is well-corrected for aberrations and is suitable for achieving the objectives of the present invention.

While the present invention has been described in connection with preferred embodiments and Working Examples, it will be understood that it is not limited to those embodiments and Working Examples. On the contrary, it is intended to cover all alternatives, modifications, and equivalents as may be included within the spirit and scope of the invention as defined in the appended claims.

What is claimed is:

1. A projection lens having an object plane and an image plane and comprising objectwise to imagewise:
    a) a first lens group having positive refractive power;
    b) a second lens group having negative refractive power;
    c) a third lens group having overall positive refractive power, and including at least three lens elements having positive refractive power;
    d) a fourth lens group having overall negative refractive power and including at least three lens elements having negative refractive power;
    e) a fifth lens group having overall positive refractive power and including at least three lens elements having positive refractive power;
    f) a sixth lens group having positive refractive power;
    g) wherein at least one of said fourth lens group and said fifth lens group includes at least one aspheric surface; and
    h) the projection lens having a numerical aperture larger than 0.6.

2. A projection lens according to claim 1, satisfying one or more of the following design conditions:

$$0.1 < f_1/f_3 < 15$$

$$0.05 < f_2/f_4 < 6$$

$$0.01 < f_5/L < 1.2$$

$$0.02 < f_6/L < 1.8$$

$$-0.3 < f_4/L < -0.005$$

$$-0.5 < f_2/L < -0.005$$

wherein the focal length of said first lens group is $f_1$, the focal length of said second lens group is $f_2$, the focal length of said third lens group is $f_3$, the focal length of said fourth lens group is $f_4$, the focal length of said fifth lens group is $f_5$, the focal length of said sixth lens group is $f_6$, and the distance from the object plane to the image plane is L.

3. A projection lens according to claim 2 wherein said second lens group includes at least five lens elements, three of which have negative refractive power, and further satisfying the design condition $$-0.3 < f_2n/L < -0.01$$

wherein the composite focal length of said third lens element through said fifth lens element in said second lens group is $f_2n$.

4. A projection lens according to claim 3, wherein at least one of said five lens elements in said second lens group includes at least one aspheric surface.

5. A projection lens according to claim 4 wherein said first lens group includes one or more lens elements and at least one aspheric surface on one of said one or more first lens group lens elements.

6. A projection lens according to claim 5, wherein said third lens group includes one or more lens elements, and at least one aspheric surface on one of said third lens group lens elements.

7. A projection lens according to claim 6, wherein said sixth lens group includes one or more lens elements and at least one aspheric surface on one of said sixth lens group lens elements.

8. A projection lens according to claim 3, wherein said fifth lens group includes a negative meniscus lens element having a concave surface, and further satisfying the design condition $$0.1 < |R_5n|/L < 0.5$$

wherein said concave surface has a radius of curvature $R_5n$.

9. A projection lens according to claim 8 wherein said sixth lens group includes a negative meniscus lens element having a concave surface and further satisfying the design condition $$0.03<|R_6n|/L<0.15$$

wherein said concave surface has a radius of curvature $R_6n$.

10. A projection lens according to claim 9 wherein said first lens group includes a lens element having negative refractive power and an image-plane-side radius of curvature of $R_1n$ and further satisfying the design condition $$0.1<|R_1n|/L<0.5.$$

11. A projection exposure apparatus comprising:
 a) the projection lens of claim 1;
 b) a reticle holder capable of holding a reticle at or near the object plane of said projection lens;
 c) a source of illumination disposed adjacent said reticle holder and opposite said projection lens; and
 d) a workpiece holder disposed adjacent said projection lens on the image-plane side, said workpiece holder capable of holding a workpiece at or near the image plane of said projection lens.

12. A projection exposure apparatus comprising:
 a) the projection lens of claim 10;
 b) a reticle holder capable of holding a reticle at or near the object plane of said projection lens;
 c) a source of illumination disposed adjacent said reticle holder and opposite said projection lens; and
 d) a workpiece holder disposed adjacent said projection lens on the image-plane side, said workpiece holder capable of holding a workpiece at or near the image plane of said projection lens.

13. A method of projection exposing patterns onto a workpiece, the method comprising the steps of:
 a) providing the projection lens of claim 1;
 b) disposing a reticle containing the patterns at or near said object plane of said projection lens;
 c) disposing the workpiece at or near said image plane; and
 d) illuminating said reticle with a source of Kohler illumination disposed adjacent said reticle and opposite said projection lens.

14. A method of projection exposing patterns onto a workpiece, the method comprising the steps of:
 a) providing the projection lens of claim 10;
 b) disposing a reticle containing the patterns at or near said object plane of said projection lens;
 c) disposing the workpiece at or near said image plane; and
 d) illuminating said reticle with a source of Kohler illumination disposed adjacent said reticle and opposite said projection lens.

15. A projection exposure apparatus comprising:
 a) the projection lens of claim 1;
 b) an object disposed at or near said projection lens object plane; and
 c) an illumination optical system disposed so as to illuminate said object to form an image at said projection lens object plane.

16. A projection exposure apparatus according to claim 15, satisfying one or more of the following design conditions:

$$0.1<f_1/f_3<15$$
$$0.05<f_2/f_4<6$$
$$0.01<f_5/L<1.2$$
$$0.02<f_6/L<1.8$$
$$-0.3<f_4/L<-0.005$$
$$-0.5<f_2/L<-0.005$$

wherein the focal length of said first lens group is $f_1$, the focal length of said second lens group is $f_2$, the focal length of said third lens group is $f_3$, the focal length of said fourth lens group is $f_4$, the focal length of said fifth lens group is $f_5$, the focal length of said sixth lens group is $f_6$, and the distance from the object plane to the image plane is L.

17. A projection exposure apparatus according to claim 16, wherein said second lens group includes at least five lens elements, three of which have negative refractive power, and further satisfying the design condition $$-0.3<f_2n/L<-0.01$$

wherein the composite focal length of said third lens element through said fifth lens element in said second lens group is $f_2n$.

18. A projection exposure apparatus according to claim 17, wherein at least one of said five lens elements in said second lens group includes at least one aspheric surface.

19. A projection exposure apparatus according to claim 18, wherein said first lens group includes one or more lens elements and at least one aspheric surface on one of said one or more first lens group lens elements.

20. A projection exposure apparatus according to claim 19, wherein said third lens group includes one or more lens elements, and at least one aspheric surface on one of said third lens group lens elements.

21. A projection exposure apparatus according to claim 20, wherein said sixth lens group includes one or more lens elements and at least one aspheric surface on one of said sixth lens group lens elements.

22. A projection exposure apparatus according to claim 20, wherein said fifth lens group includes a negative meniscus lens element having a concave surface, and further satisfying the design condition $$0.1<|R_5n|/L<0.5$$

wherein said concave surface has a radius of curvature $R_5n$.

23. A projection exposure apparatus according to claim 21, wherein said sixth lens group includes a negative meniscus lens element having a concave surface and further satisfying the design condition $$0.03<|R_6n|/L<0.15$$

wherein said concave surface has a radius of curvature $R_6n$.

24. A projection exposure apparatus according to claim 23, wherein said first lens group includes a lens element having negative refractive power and an image-plane-side radius of curvature of $R_1n$ and further satisfying the design condition $$0.1<|R_1n|/L<0.5.$$

* * * * *